United States Patent
Hayano et al.

(10) Patent No.: US 6,824,958 B2
(45) Date of Patent: Nov. 30, 2004

(54) METHOD OF MANUFACTURING PHOTOMASK AND METHOD OF MANUFACTURING SEMICONDUCTOR INTEGRATED CIRCUIT DEVICE

(75) Inventors: Katsuya Hayano, Akishima (JP); Norio Hasegawa, Hinode (JP)

(73) Assignee: Renesas Technology Corp., Tokyo (JP)

( * ) Notice: Subject to any disclaimer, the term of this patent is extended or adjusted under 35 U.S.C. 154(b) by 215 days.

(21) Appl. No.: 10/025,457

(22) Filed: Dec. 26, 2001

(65) Prior Publication Data

US 2002/0102476 A1 Aug. 1, 2002

(30) Foreign Application Priority Data

Dec. 26, 2000 (JP) ........................ 2000-395447

(51) Int. Cl.[7] .............................. G03C 5/00; G03F 9/00
(52) U.S. Cl. .......................... 430/311; 430/5; 430/394; 430/396
(58) Field of Search .............................. 430/5, 313, 396, 430/311, 394

(56) References Cited

U.S. PATENT DOCUMENTS

| | | |
|---|---|---|
| 4,684,971 A | 8/1987 | Payne |
| 5,376,483 A | 12/1994 | Rolfson |
| 5,378,585 A | 1/1995 | Watanabe |
| 5,389,474 A | 2/1995 | Iguchi et al. |
| 5,418,092 A | 5/1995 | Okamoto |
| 5,556,724 A | 9/1996 | Tarumoto et al. |
| 5,741,613 A | 4/1998 | Moon et al. |
| 5,948,572 A | 9/1999 | Liu et al. |
| 5,989,760 A | 11/1999 | Mangat et al. |
| 6,653,025 B2 * | 11/2003 | Nishi ........................... 430/5 |

FOREIGN PATENT DOCUMENTS

| | | |
|---|---|---|
| JP | 56-30129 | 3/1981 |
| JP | 59-22050 | 4/1984 |
| JP | 5-289307 | 11/1993 |
| JP | 2000-17196 | 1/2000 |

OTHER PUBLICATIONS

Nikkei Microdevices, Apr. 2000, p. 145, 146.
Nikkei Microdevices, May 2000, p. 143–152.
Optical Microlithography XIII 1–3, Mar. 2000, p. 647–657.

* cited by examiner

*Primary Examiner*—Saleha R. Mohamedulla
(74) *Attorney, Agent, or Firm*—Antonelli, Terry, Stout & Kraus, LLP

(57) ABSTRACT

Disclosed is a technique capable of reducing the manufacturing time of a photomask. In a method of transferring a predetermined pattern onto a semiconductor wafer by reduced projection exposure using a product mask manufactured by performing the reduced projection exposure to a pattern of an IP mask Mm1, the IP mask Mm1 is designed to have a resist mask structure in which a light-shielding pattern thereof is constituted of an organic film such as a resist film.

19 Claims, 32 Drawing Sheets

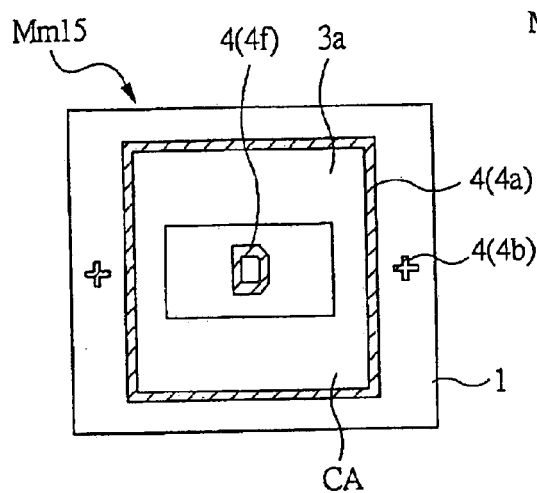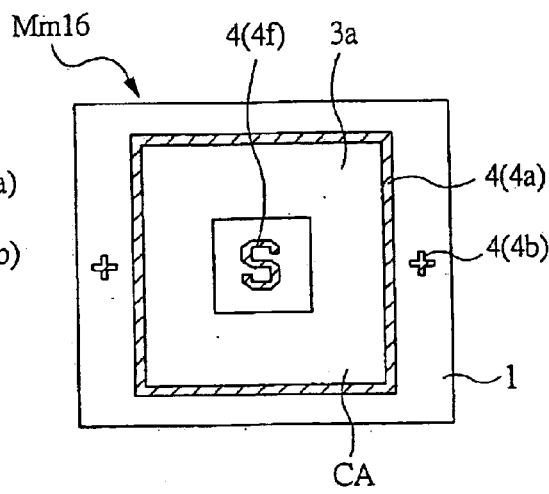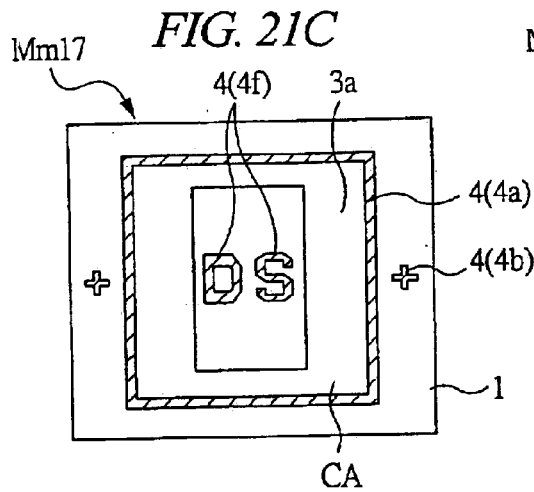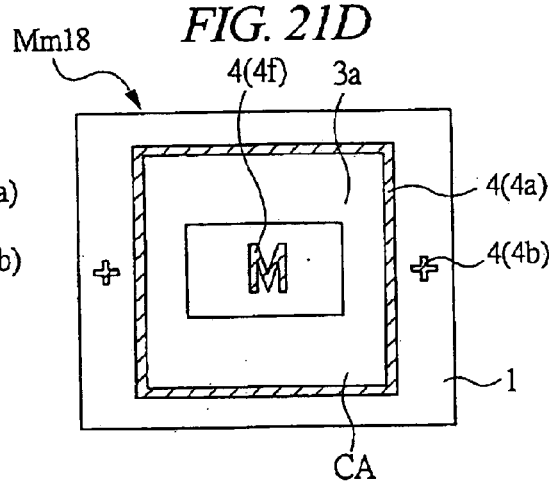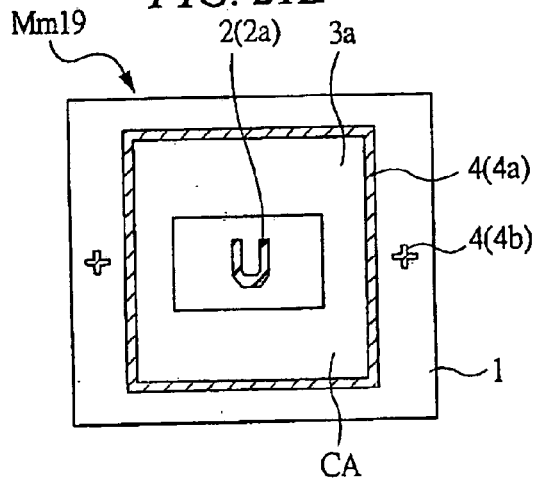

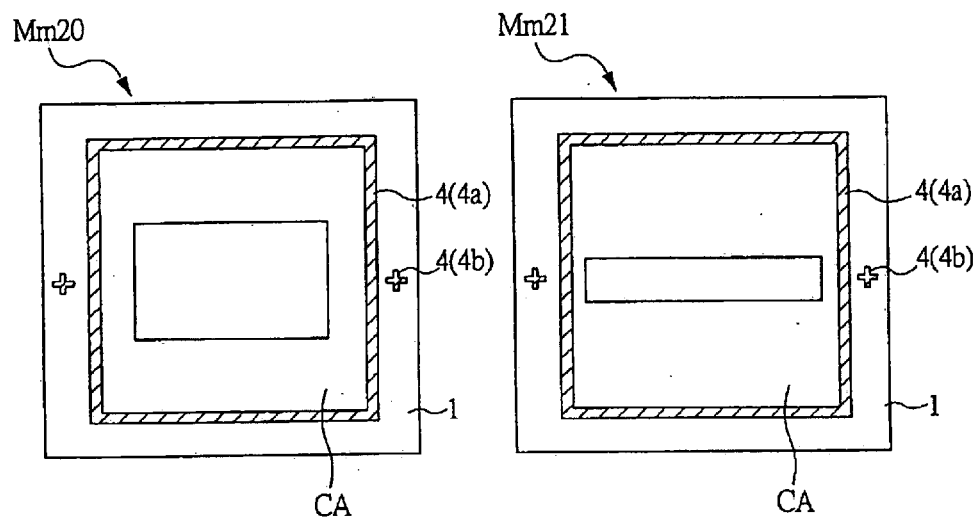
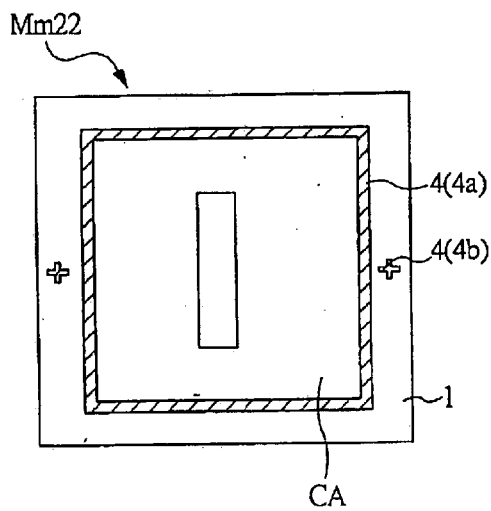

METHOD OF MANUFACTURING PHOTOMASK AND METHOD OF MANUFACTURING SEMICONDUCTOR INTEGRATED CIRCUIT DEVICE

TECHNICAL FIELD OF THE INVENTION

The present invention relates to a method of manufacturing a photomask and a technique for manufacturing a semiconductor integrated circuit device. Particularly, the present invention relates to a technique effectively applicable to a photolithography (hereinafter, referred to as lithography) technique, in which a predetermined pattern is transferred onto a semiconductor wafer (hereinafter, referred to as a wafer) by the exposure using a photomask (hereinafter, referred to as a mask) in the manufacturing process of a semiconductor integrated circuit device.

BACKGROUND OF THE INVENTION

With the increasing demand for further scaling down of dimensions and the integration of patterns such as an element and circuit wiring, the increase in the mask cost has become a problem. This is caused by the various factors as follows: since the scaling down of dimensions and the high accuracy are required also in mask patterns even under the circumstance where the market size of the mask manufacturing field is small and the mask manufacturing is not commercially viable, a costly pattern writing apparatus and an inspection apparatus are required and the equipment cost and the running cost thereof become enormous; it becomes necessary to introduce novel technologies such as a phase shift technology and an optical proximity correction technology; and the defect rate of the mask is increased due to the scaling down of the pattern. With the improvement in the performance of the semiconductor integrated circuit device, the total number of masks required to manufacture one semiconductor integrated circuit device tends to increase. This tendency also causes an important problem to be solved, that is, how to reduce the mask cost.

Techniques for solving such problems are disclosed in, for example, pp. 145 and 146 of "Nikkei Micro Device, April-2000 issue" issued on Apr. 1, 2000, by the Nikkei Business Publications, Inc., pp. 142 to 152 of "Nikkei Micro Device, May-2000 issue" issued on May 1, 2000, by the Nikkei Business Publications, Inc., Japanese Patent Application Laid-Open No. 2000-17196, and pp. 647 to 657 of "Optical Microlithography XIII Mar. 1–3, 2000 Santa Clara, USA" issued by PROCEEDINGS OF SPIE SPIE—The International Society for Optical Engineering. In these descriptions, disclosed are techniques in which a mask serving as a master (master mask) having high writing accuracy in dimensions is manufactured, patterns of the master mask are transferred onto a daughter mask using a reduced projection exposure apparatus, and the pattern is transferred onto a wafer using the daughter mask. Specifically, masks (master mask and daughter mask) are manufactured according to the process as follows.

Firstly, a mask substrate for a master mask is prepared. On this mask substrate, for example, a metal film such as chromium and a resist film are deposited in this order from below. Subsequently, after a pattern twenty times as large as the design rule is written on the resist film on the master mask, the lower metal film is patterned by the etching method using a resist pattern formed by the development as an etching mask, and thus the master mask is manufactured. Thereafter, a mask substrate for the daughter mask, which is identical to that for the master mask, is prepared. Subsequently, after the mask pattern of the master mask is written on a resist film of the mask substrate for the daughter mask using the reduced projection exposure apparatus such as an i-beam stepper, the metal film is etched similarly to the case of the master mask, and thus the daughter mask is manufactured. In this technique, the costly electron beam writing system is not required. Therefore, the reduction of the mask cost can be promoted.

SUMMARY OF THE INVENTION

However, the inventors of the present invention found out that the manufacturing technique of the mask (master mask and daughter mask) described above had problems as follows.

First, an adequate consideration is not given to manufacture a mask efficiently and in a short time. Specifically, in the techniques described above, though the master mask is used only once or not more than a few times, the pattern of the master mask is formed by etching the metal film thereof similarly to the normal mask having fine patterns. Therefore, it takes much time to manufacture the master mask, resulting in the occurrence of the problem that the reduction of the manufacturing time of a semiconductor integrated circuit device is hindered. Such a problem becomes severe particularly in the manufacturing of a customized product such as an LSI. The higher the performance required to the customized product becomes, the more the number of process steps and the amount of time for its development are needed. On the other hand, existing products become outdated rapidly and a lifetime of such products is short. Therefore, demands for reducing the amount of time spent on the development and manufacturing of the product have been more and more increased. Accordingly, an important problem to be solved has caused, that is, how to manufacture a mask, which is used in the manufacturing of the customized product, efficiently and in a short time.

Second, appropriate measures are not taken to further reduce the mask cost. Specifically, in the techniques described above, since the master mask is used for the exposure only once or not more than a few times, the manufacturing cost of the master mask is increased, resulting in the occurrence of the problem that the cost reduction of a semiconductor integrated circuit device is hindered. Such a problem also becomes severe particularly in the manufacturing of a customized product. This is because the amount of production of such customized products per one kind is smaller in comparison to general-purpose products such as DRAM.

An object of the present invention is to provide a technique capable of reducing the manufacturing time of a mask.

Also, another object of the present invention is to provide a technique capable of reducing the manufacturing time of a semiconductor integrated circuit device.

Also, another object of the present invention is to provide a technique capable of reducing the mask cost.

Further, another object of the present invention is to provide a technique capable of reducing the cost of a semiconductor integrated circuit device.

Other objects and novel characteristics of the present invention will be apparent according to the description and the accompanying drawings of this specification.

The outline of the typical one of the inventions disclosed in this application will be described as follows.

Specifically, the present invention includes the step of transferring each pattern of a plurality of first masks including one or more resist masks onto a second mask by the reduced projection exposure, thereafter transferring the pattern on the second mask onto a semiconductor wafer by the reduced projection exposure.

In addition, the present invention includes the step of transferring each pattern of a plurality of IP masks including one or more resist masks onto a product mask by the reduced projection exposure, thereafter transferring the pattern on the product mask onto a semiconductor wafer by the reduced projection exposure.

Also, in the present invention, the product mask has a metal pattern having a light-shielding property to exposure light.

Also, in the present invention, the product mask is a resist mask.

Also, in the present invention, the product mask has both of a metal pattern having a light-shielding property to exposure light and an organic film pattern having a light-shielding property or a light-reducing property to exposure light.

Also, in the present invention, the organic film pattern is arranged in only a part of a pattern transfer region of the product mask.

Also, in the present invention, the pattern transfer region is a user logic circuit section.

Also, the present invention includes the step of: forming an organic film pattern again after removing the organic film pattern of the product mask.

Also, the present invention includes the steps of: preparing a first IP mask made of a resist film, which is a photomask used in the transfer of a memory mat or an aggregate of the memory mats; preparing a second IP mask made of a resist mask, which is a photomask used in the transfer of a peripheral circuit region of the memory mat; transferring the patterns of the first and second IP masks onto a product mask by the reduced projection exposure; and transferring the pattern on the product mask onto a semiconductor wafer by the reduced projection exposure.

BRIEF DESCRIPTION OF THE DRAWINGS

FIG. 12A shows a mask used in the transfer of circuit region 10a of FIG. 11, FIG. 12B shows a mask used in the transfer of circuit region 10b of FIG. 11, FIG. 12C shows a mask used in the transfer of circuit region 10c of FIG. 11, FIG. 12D shows a mask used in the transfer of circuit region 10d of FIG. 11, and FIG. 12E shows a mask used in the transfer of circuit region 10e of FIG. 11;

Figure 15:
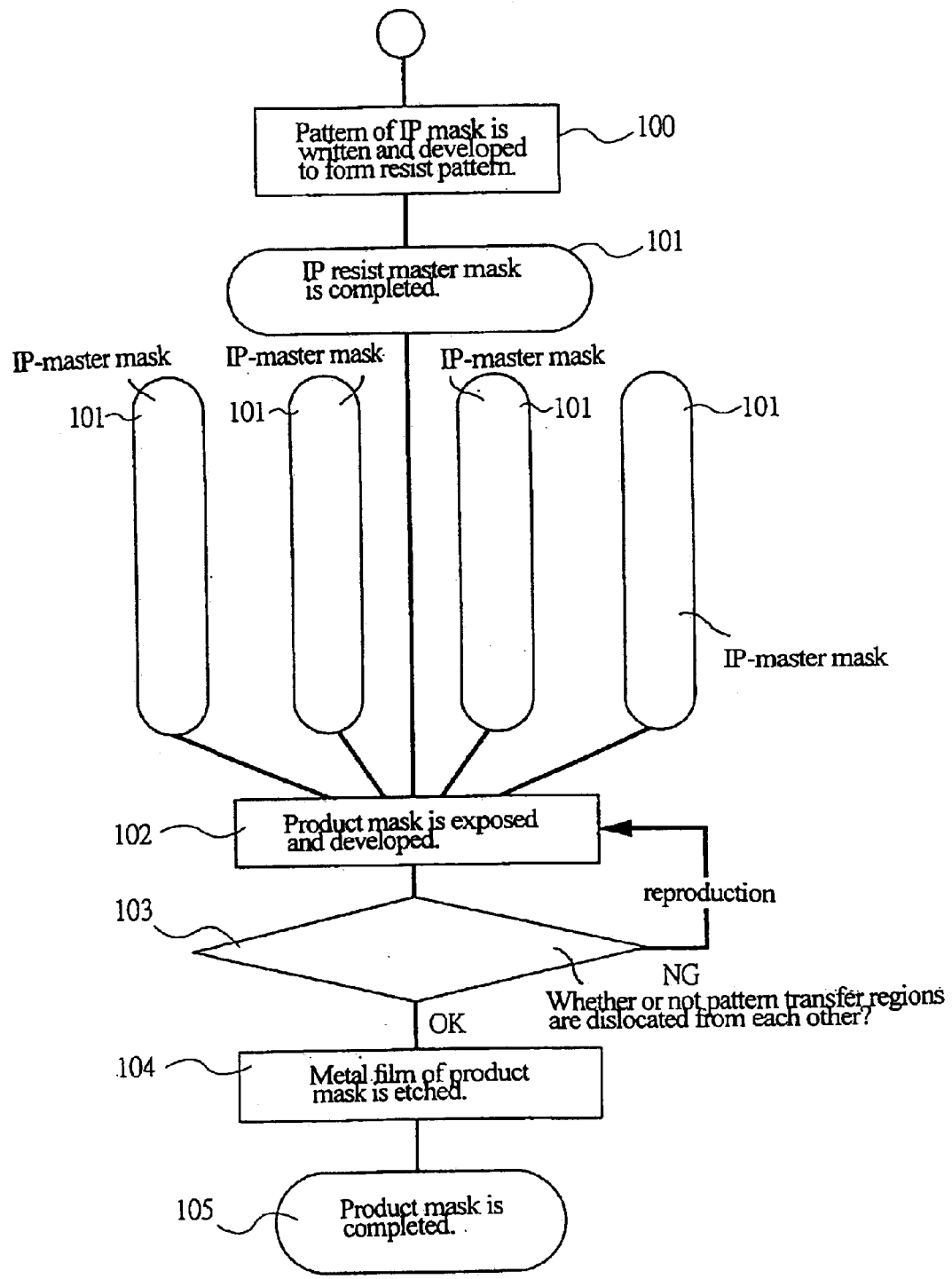
FIG. 15 is a flow chart showing the manufacturing process of the photomask used in the method of manufacturing a semiconductor integrated circuit device according to another embodiment of the present invention.
Figure 16A:
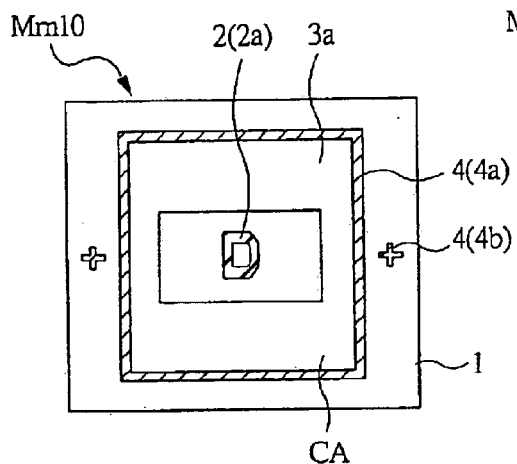
FIGS. 16A to 16E are general plan views showing an example of the photomasks used in the manufacturing process of FIG. 15, namely, each pattern of circuit regions is shown schematically as an alphabet "D" for FIG. 16A, "S"
Figure 16B:
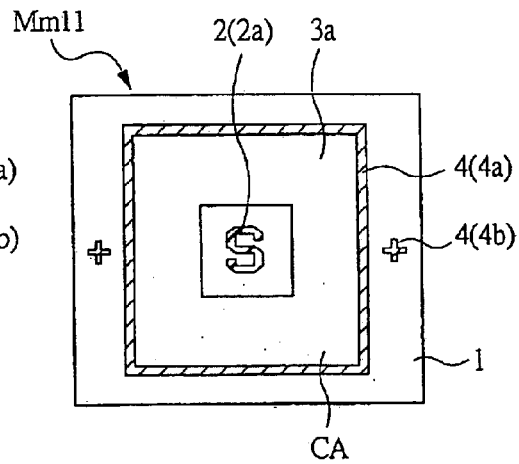
Figure 16C:
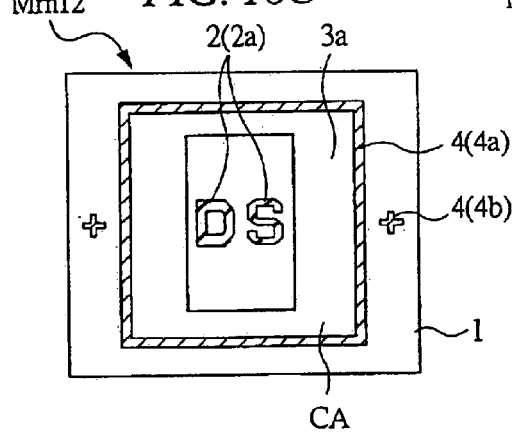
Figure 16D:
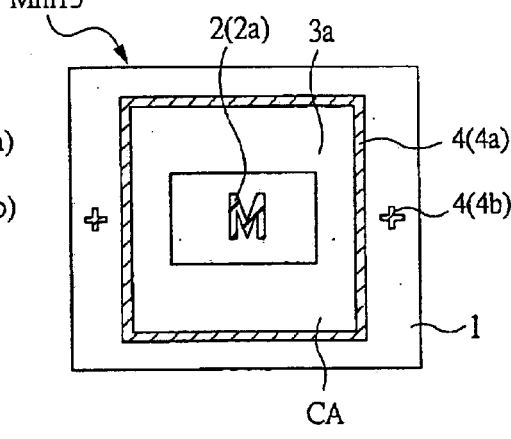
Figure 16E:
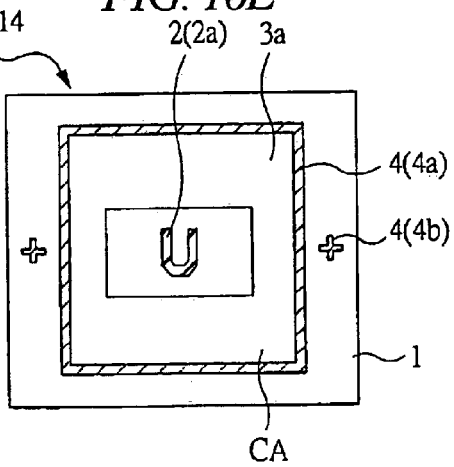
Figure 17:
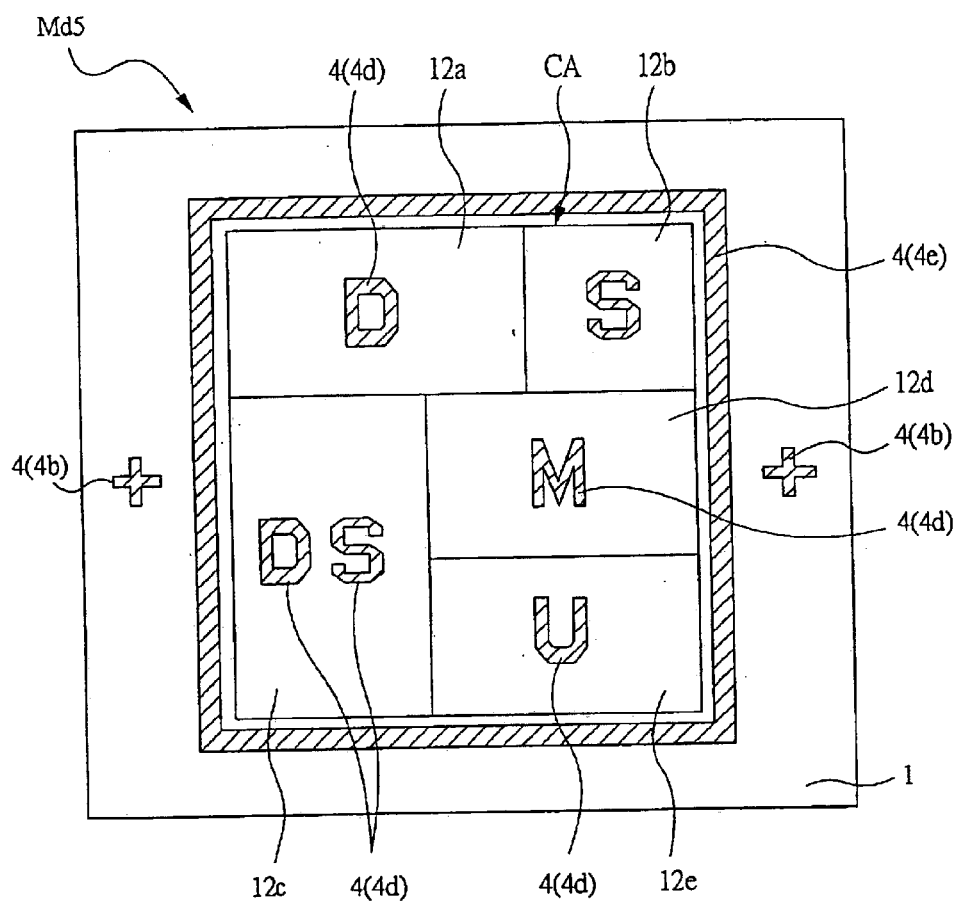
Figure 18:
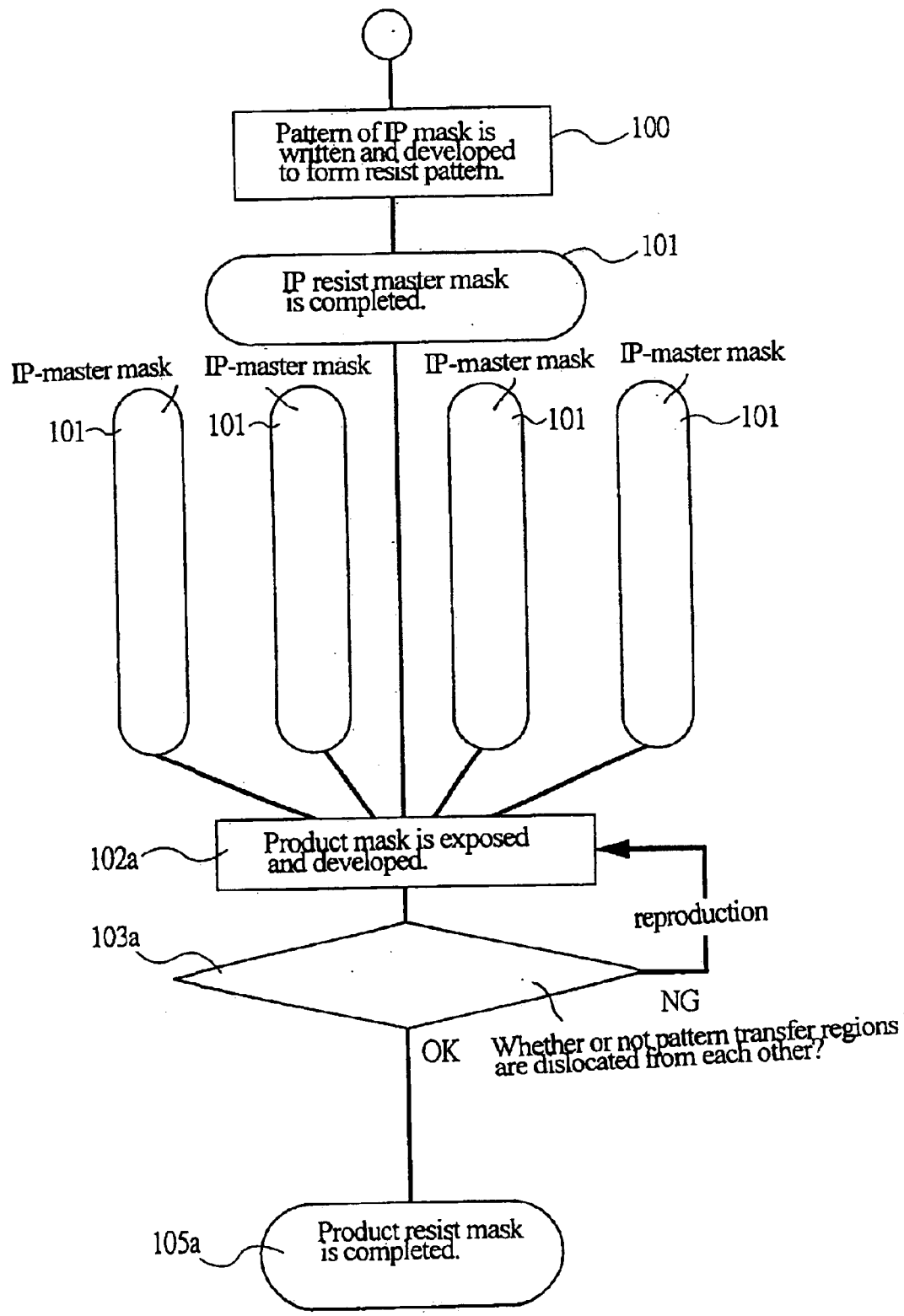
Figure 19:
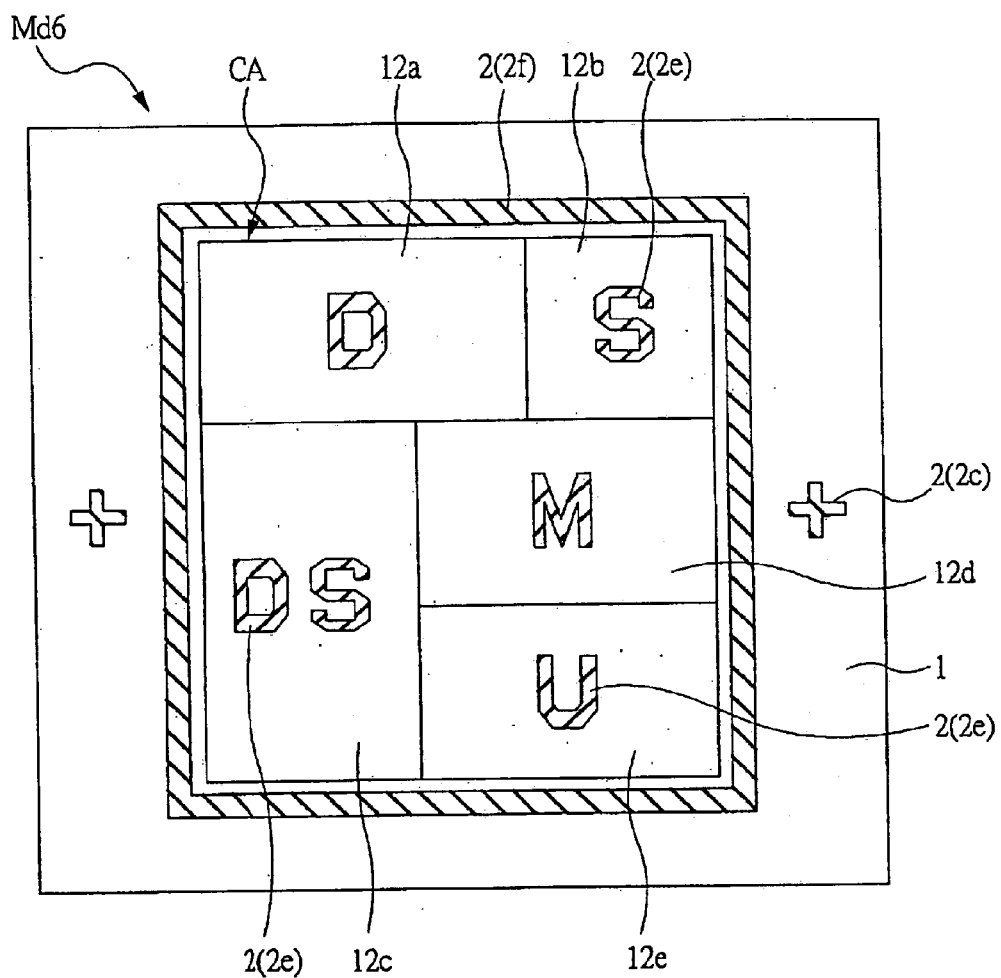
Figure 20:
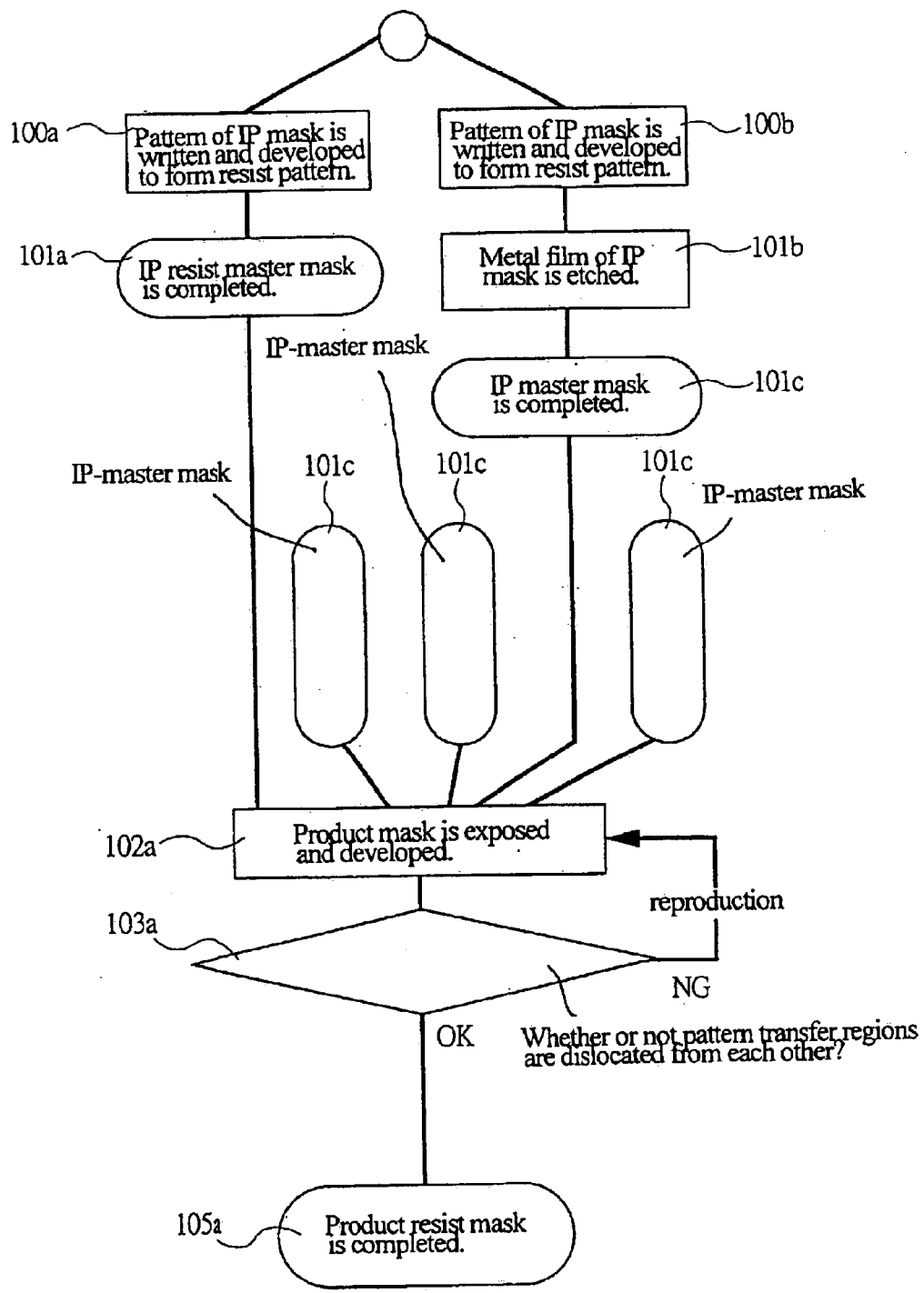
Figure 22A:
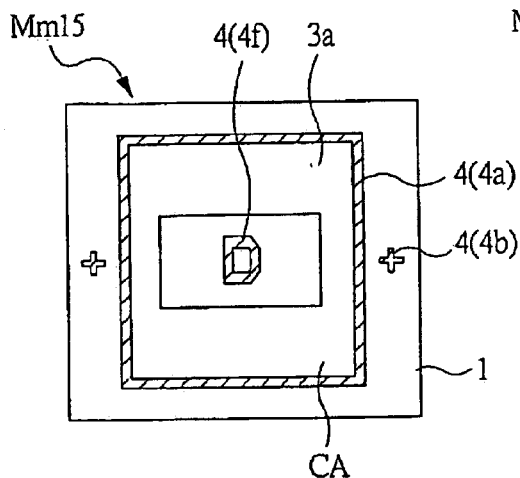
Figure 22B:
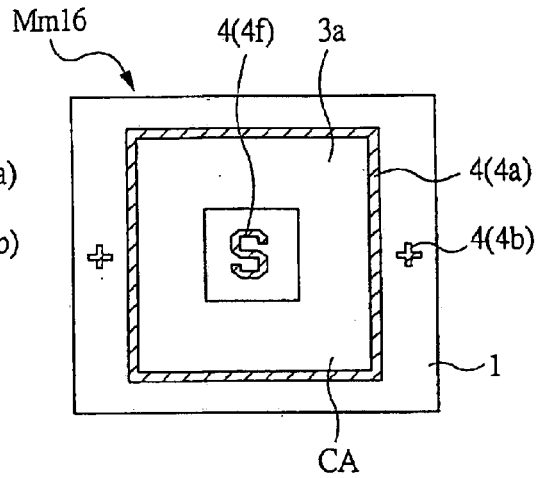
Figure 22C:
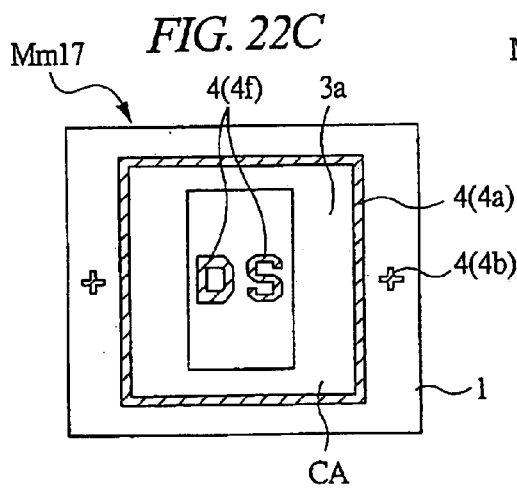
Figure 22D:
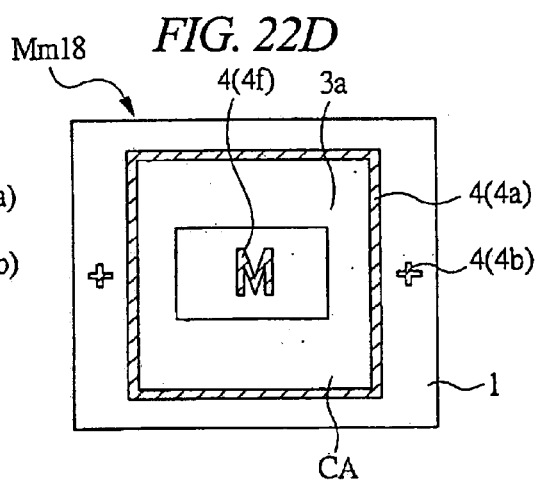
Figure 22E:
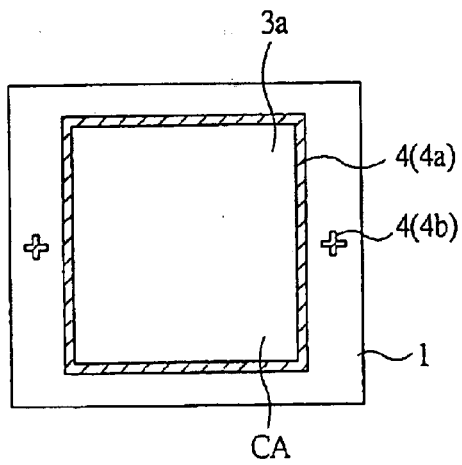
Figure 23A:
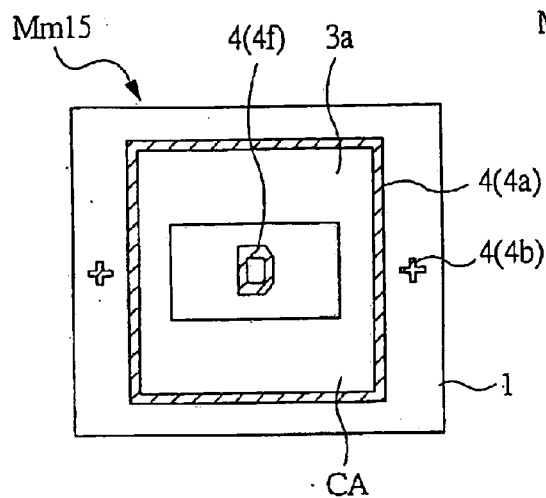
Figure 23B:
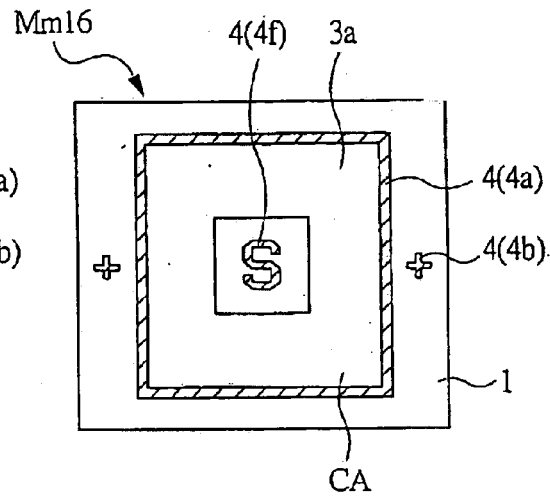
Figure 23C:
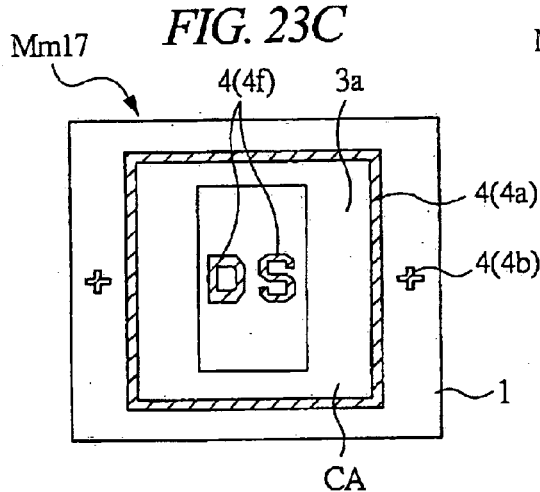
Figure 23D:
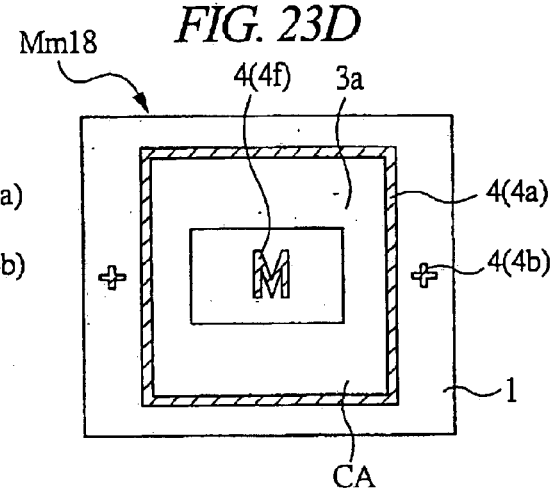
Figure 23E:
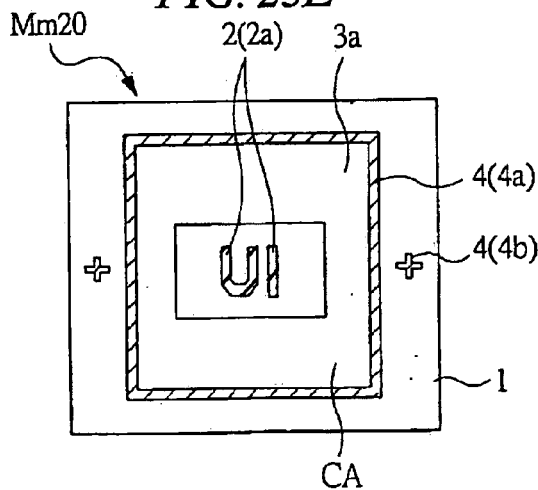
Figure 24:
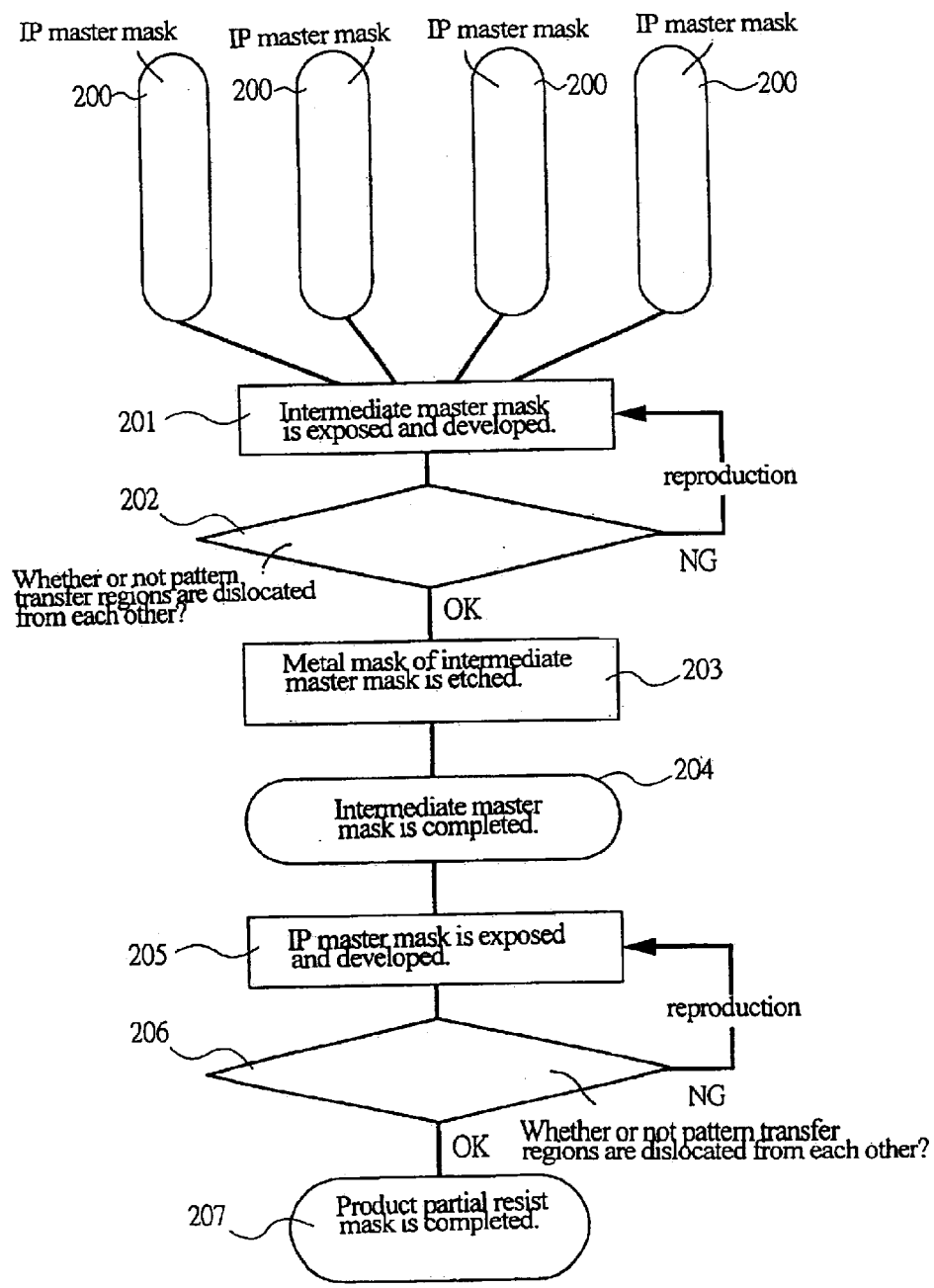
Figure 25:
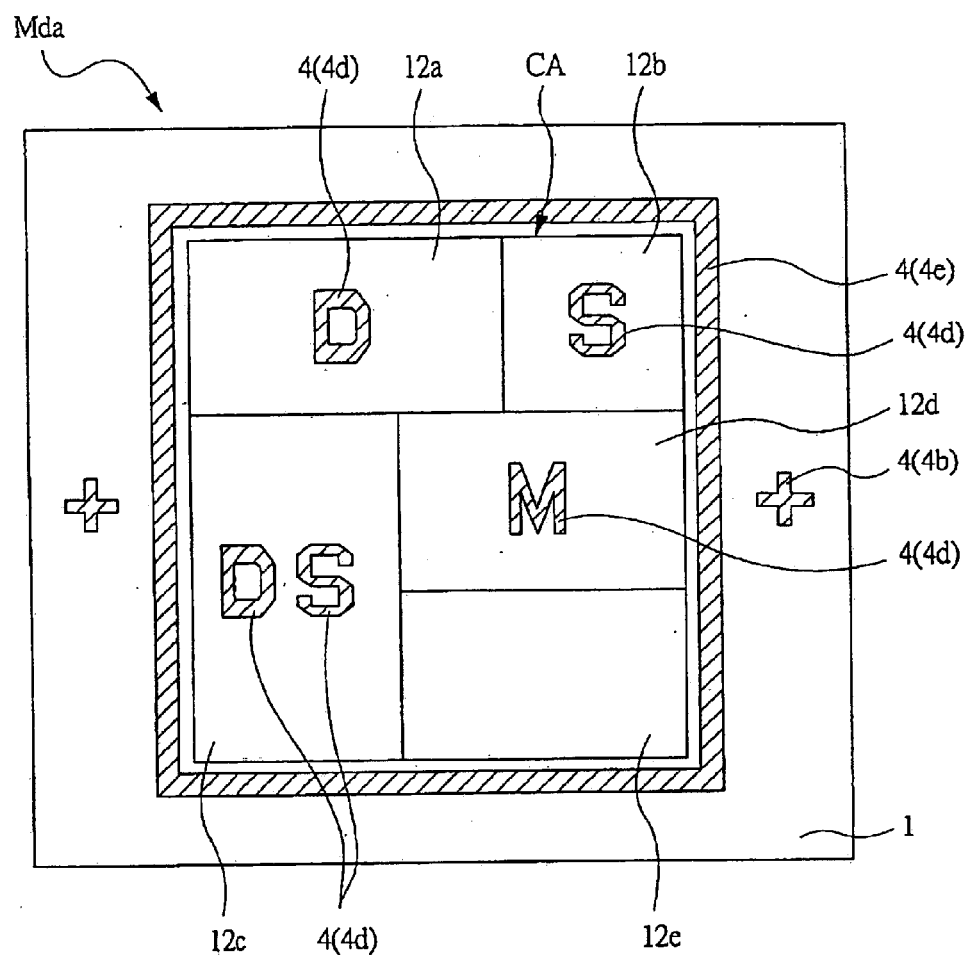
Figure 26:
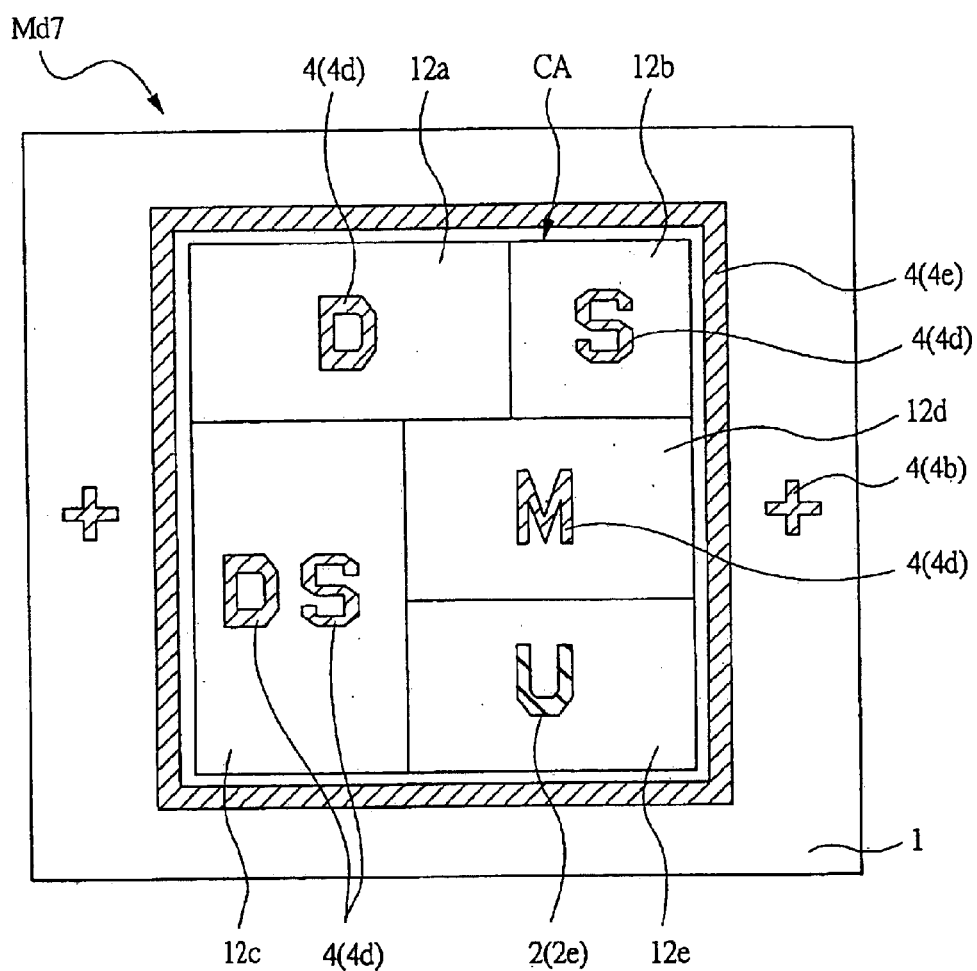
Figure 27:
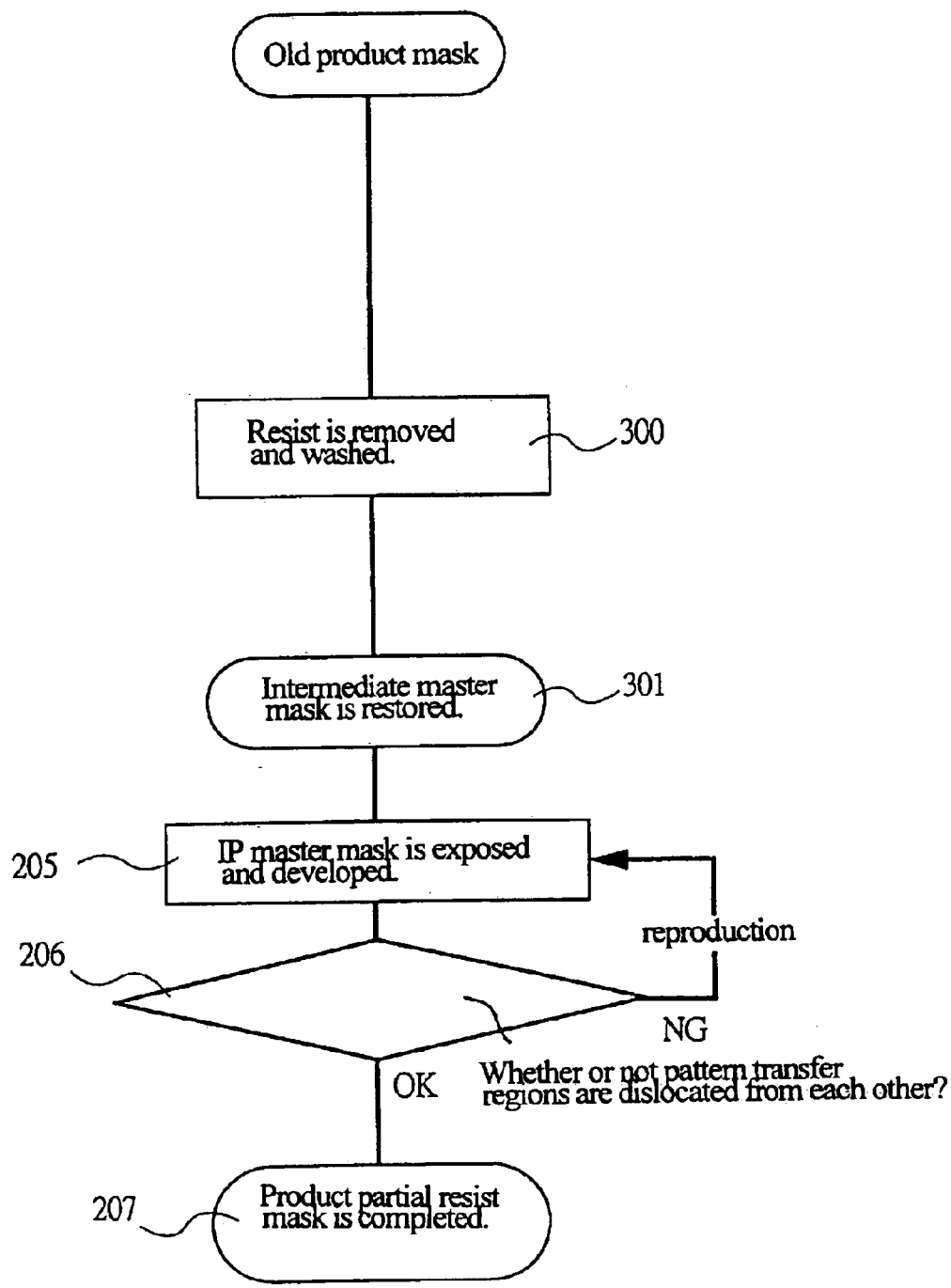
Figure 28:
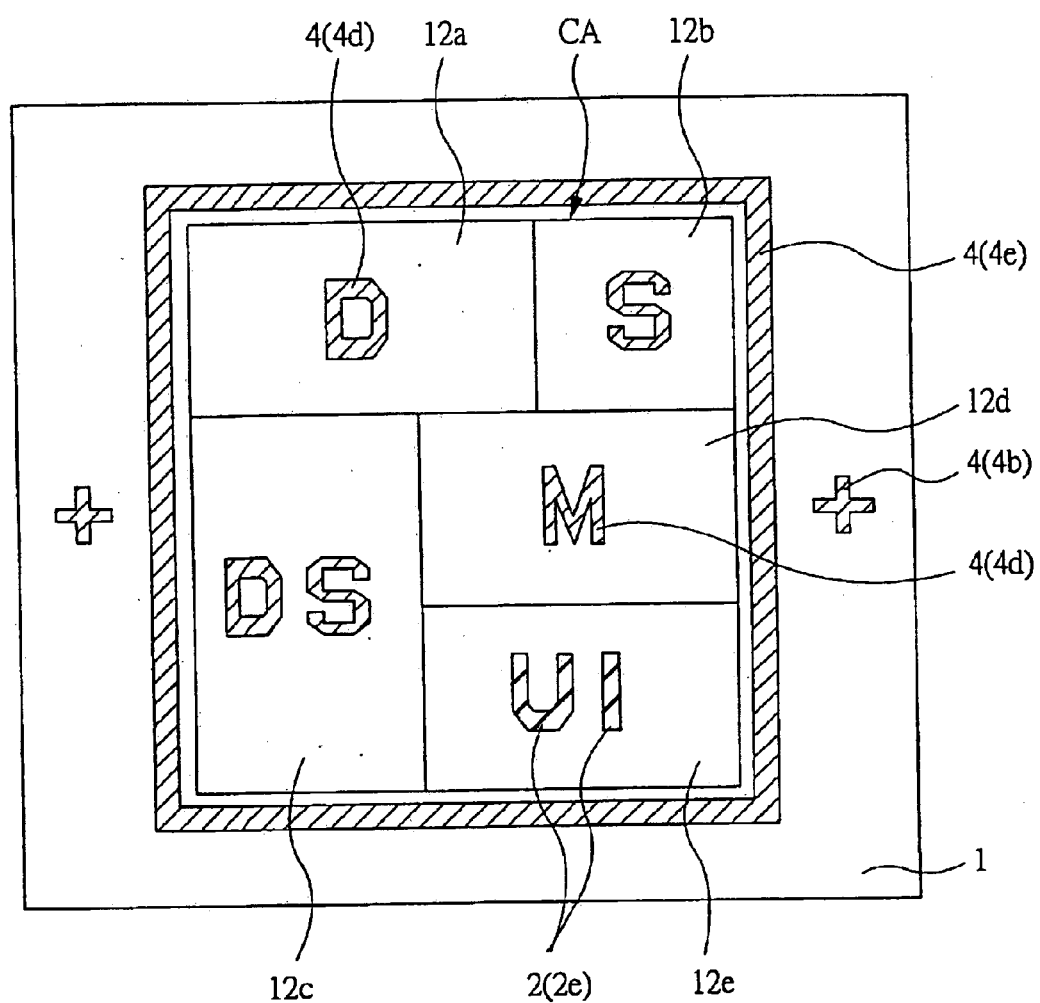
Figure 29:
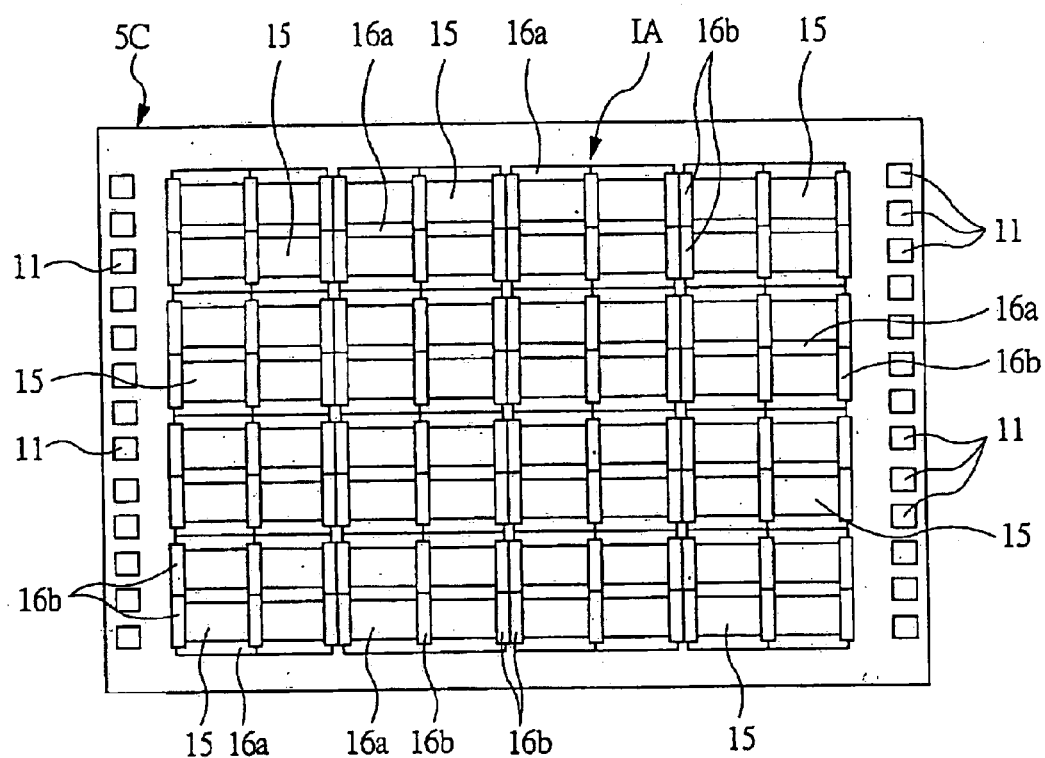
Figure 31:
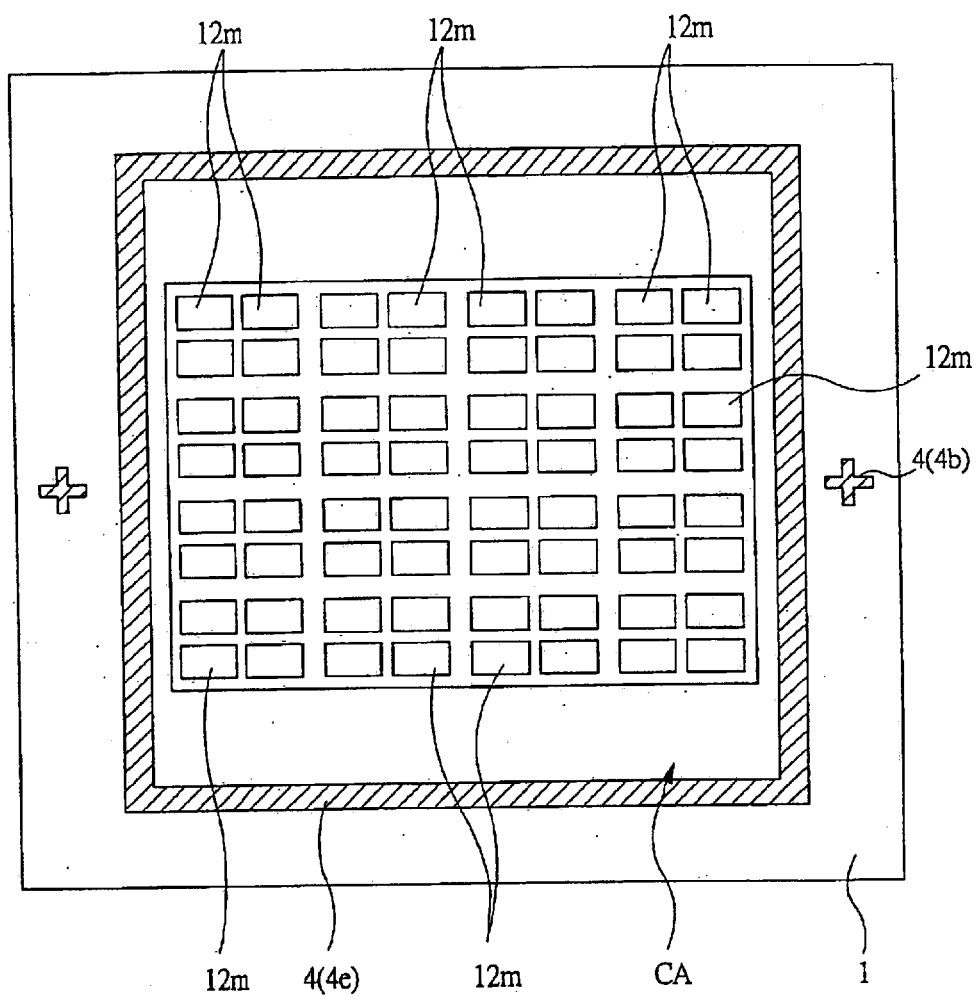
Figure 32:
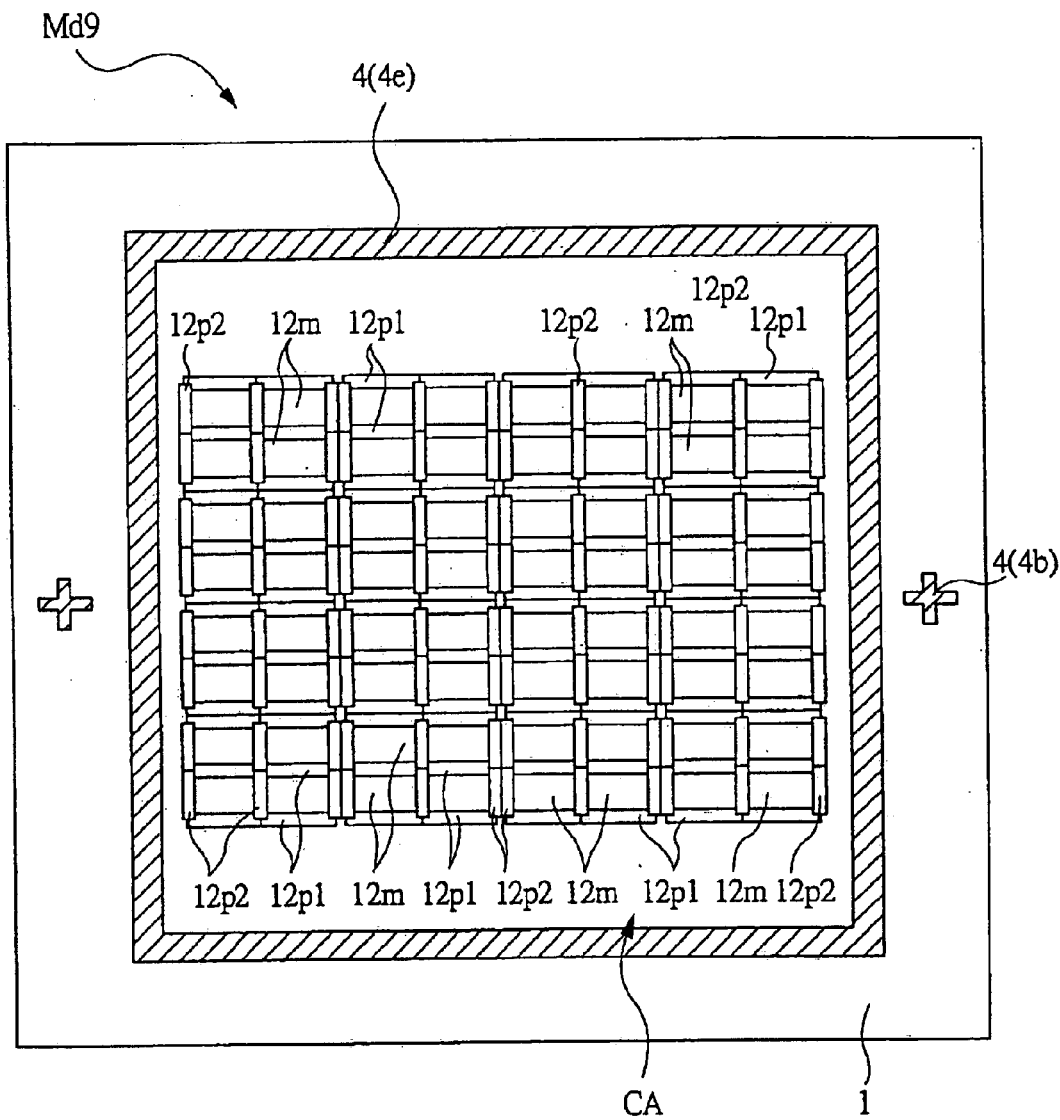

for FIG. 16B, "DS" for FIG. 16C, "M" for FIG. 16D and "U" for FIG. 16E;

FIG. 17 is a general plan view showing an example of the photomask manufactured by the manufacturing process of FIG. 15;

FIG. 18 is a flow chart showing the manufacturing process of a photomask used in the method of manufacturing a semiconductor integrated circuit device according to another embodiment of the present invention;

FIG. 19 is a general plan view showing an example of the photomask manufactured by the manufacturing process of FIG. 18;

FIG. 20 is a flow chart showing the manufacturing process of a photomask used in the method of manufacturing a semiconductor integrated circuit device according to another embodiment of the present invention;

FIG. 21A to FIG. 21E are general plan views showing an example of photomasks used in the manufacturing process of FIG. 20, namely, each pattern of circuit regions is shown schematically as an alphabet "D" for FIG. 21A, "S" for FIG. 21B, "DS" for FIG. 21C, "M" for FIG. 21D and "U" for FIG. 21E;

FIG. 22A to FIG. 22E are general plan views showing an example of the photomasks used in the manufacturing process of FIG. 20 as shown in FIGS. 21A to 21D but FIG. 22E shows the photomask where an electron beam resist file is coated on a main surface of the mask for modifying a pattern of the mask;

FIG. 23A to FIG. 23E are general plan views showing an example of the photomasks used in the manufacturing process of FIG. 20 as shown in FIGS. 21A to 21D but FIG. 23E shows the photomask with a modification having a pattern as an alphabet "UI";

FIG. 24 is a flow chart showing the manufacturing process of a photomask used in the method of manufacturing a semiconductor integrated circuit device according to another embodiment of the present invention;

FIG. 25 is a general plan view showing an example of a photomask manufactured by the manufacturing process of FIG. 24;

FIG. 26 is a general plan view showing an example of a photomask manufactured by the manufacturing process of FIG. 24;

FIG. 27 is a flow chart showing the manufacturing process of a photomask used in the method of manufacturing a semiconductor integrated circuit device according to another embodiment of the present invention;

FIG. 28 is a general plan view showing an example of a photomask manufactured by the manufacturing process of FIG. 27;

FIG. 29 is a general plan view showing an example of a semiconductor chip constituting a semiconductor integrated circuit device according to still another embodiment of the present invention;

FIG. 30A to FIG. 30C are general plan views showing an example of photomasks used to manufacture the semiconductor integrated circuit device of FIG. 29, namely, FIG. 30A shows an IP mask used in transferring a pattern of a memory mat, FIG. 30B shows an IP mask used in transferring a pattern of a peripheral circuit region, and FIG. 30C shows an IP mask used in transferring a pattern of a peripheral circuit region;

FIG. 31 is a general plan view showing an example of a photomask under fabrication used to manufacture the semiconductor integrated circuit device of FIG. 29; and FIG. 32 shows an example of a product mask manufactured using the IP masks Mm20 to Mm22 shown in FIGS. 30A to 30C.

DESCRIPTION OF THE PREFERRED EMBODIMENTS

In advance of the detail description of the present invention in this application, technical terms employed in this application will be described as follows.

1. IP (Intellectual Property): A circuit block or a functional block capable of reusing a circuit functional block, which has already been designed and operation thereof has been verified, as a design property. To be concrete, a macro cell can be enumerated.

2. Macro Cell: A circuit block or a functional block, which is superior to a basic cell in performance, is large scale, and is dedicated to a specific application. The macro cell is classified into a hard macro cell having a fixed mask pattern and a soft macro cell in which library data is limited to the net list representation and the mask pattern thereof is created in every design decision. As the macro cell, a standard cell (polycell) showing a small-scale logic gate and having a constant height, a module cell such as: RAM (Random Access Memory) having a regular layout structure and automatically generated in accordance with an input parameter by a module generator; a ROM (Read Only Memory); PLA (Programmable Logic Array); a multiplier; an accumulator; and a data path, a CPU (Central Processing Unit), an analog cell, I/O (Input/Output) cell and the like are enumerated. With respect to the macro cell, in addition to the mask pattern data, data such as cell frame data and terminal data for automatic wiring, and functional model, logic model, delay parameter and the like for simulation are registered to a design system (computer or the like) as a cell library. Such data are easily read out from the cell library and used in such a case of the simulation or the like. As an example of the RAM, DRAM (Dynamic RAM), SRAM (Static RAM), and FRAM (Ferroelectric RAM) are enumerated. In addition, as an example of the ROM, mask POM, flash memory (EEPROM; Electric Erasable Programmable ROM) and the like are enumerated.

3. Mask (Photomask): A mask made by forming a pattern for shielding light and a pattern for shifting a phase of light on a mask substrate. It includes a reticle having a pattern several times as large as a pattern of the actual size formed thereon. A first main surface of the mask indicates a pattern surface on which the pattern for shielding light and the pattern for shifting the phase of light are formed, and a second main surface of the mask indicates the other side of the first main surface (i.e., a reverse surface).

4. Product Mask: A kind of above-described mask, which is called a daughter mask or an intermediate mask and is used to transfer a pattern onto a substrate to be transferred such as a wafer.

5. Master Mask: A kind of above-described mask, which is used to transfer the pattern onto the product mask, and on which a pattern several times as large as that of the product mask is formed. IP (Intellectual Property) mask in the embodiments is also one of the master masks.

6. Normal Mask: A kind of above-described mask. It indicates a normal mask in which a mask pattern is formed of a light-shielding pattern made of metal and a transparent pattern on a mask substrate.

7. Resist Mask: A kind of above-described mask. It indicates a mask having a light-shielding member (light-shielding film, light-shielding pattern, and light-shielding region or the like) made of an organic film on a mask substrate. Specifically, the resist mask in this application is the one obtained by performing the patterning of a film having a photosensitive resist as a base by the exposure using an energy beam such as electron beam (ion beam) and light (ultraviolet light such as vacuum ultraviolet light, far ultraviolet light, and near ultraviolet light and visible light) or the photolithography technique. A light-blocking film completely or partly blocks visible light and ultraviolet light such as vacuum ultraviolet light, far ultraviolet light, and near ultraviolet light. Photosensitivity is an inherent attribute of the resin itself, and an emulsion mask or the like in which added composition such as silver halide mainly forms the photosensitivity is not included in the resist mask mentioned here in principle. However, it goes without saying that a variety of additives including the foregoing may be contained in the resist mask.

8. The pattern surfaces of the masks (normal mask and resist mask mentioned above) are classified into the regions below. A region in which integrated circuit pattern to be transferred is arranged is referred to as an "integrated circuit pattern region", and an outer peripheral region thereof is referred to as a "peripheral region". A plurality of chip regions are arranged in this integrated circuit pattern region.

9. When "light-shielding member", "light-shielding region", "light-shielding film", and "light-shielding pattern" are mentioned, it means that they have an optical property that exposure light irradiated onto the regions thereof is penetrated by 40% or less. Generally, the one capable of penetrating the light by several % to not more than 30% is used. On the other hand, if "transparent", "transparent film", "transparent region", and "transparent pattern" are mentioned, it means that they have an optical property that exposure light irradiated onto the regions is penetrated by 60% or more. Generally, the one capable of penetrating the light by 90% or more is used.

10. Wafer: A wafer includes a single crystal silicon substrate (having an approximately flat, round shape in general), a sapphire substrate, a glass substrate, other insulating or semi-insulating substrate, a semiconductor substrate, and a substrate made by combination thereof, which are used in the manufacturing of an integrated circuit. In addition, a semiconductor integrated circuit device in this application is not limited to the one made on the semiconductor or insulating substrate such as the silicon wafer and the sapphire substrate, and it includes the one made on other insulating substrate such as glass, for example, TFT (Thin Film Transistor) and STN (Super-Twisted-Nematic) liquid crystal unless clearly specified to the contrary.

11. Device Surface: A main surface of a wafer. It indicates a surface on which a device pattern corresponding to a plurality of chip regions is formed by the lithography.

12. Transferred Pattern: A pattern transferred onto a wafer by a mask. Concretely, it indicates a photoresist pattern (hereinafter, referred to as a resist) or a pattern actually formed on a wafer by using a photoresist pattern as a mask.

13. Resist Pattern: A film pattern formed by patterning a photosensitive resin film (resist film) by the photolithography method. Note that this pattern includes a mere resist film having no openings with respect to the portion concerned.

14. Normal Illumination: An undeformed illumination. It indicates an illumination having relatively uniform light intensity distribution.

15. Deformed Illumination: An illumination whose illuminance at the central portion is lowered. It includes oblique illumination, annular illumination, multi-pole illumination such as 4-pole illumination and 5-pole illumination, or a super resolution technique by a pupil filter equivalent to the foregoing illuminations.

16. Scanning Exposure: An exposure method in which thin slit-shaped exposure band is moved (scanning) relatively and continuously on a wafer and a mask in the orthogonal direction to the longitudinal direction of the slit (may be moved in the diagonal direction), and then a circuit pattern on the mask is transferred onto a desired position on the wafer. The apparatus performing this exposure method is a scanner.

17. Step and Scan Exposure: An exposure method for performing the exposure to the entire portion to be exposed on a wafer by using the scanning exposure and a stepping exposure in combination. It represents a narrower concept of the scanning exposure.

18. Step and Repeat Exposure: An exposure method in which a wafer is repeatedly stepped relative to a projected image of a circuit pattern on a mask, and thus the circuit pattern on the mask is transferred onto a desired position on the wafer. The apparatus performing this exposure method is a stepper.

In the embodiments described below, the description will be made after being divided into a plurality of sections or embodiments when required as a matter of convenience. However, these sections or embodiments are not irrelevant to each other unless clearly specified to the contrary, and the one relates to the entire or a part of the other as a modification example, details, or a supplementary explanation thereof.

Also, in the embodiments described below, when referring to the number of an element (including number of pieces, values, amount, range, or the like), the number of the element is not limited to a specific number unless clearly specified or except the case where the number is apparently limited to a specific number in principle. The number larger or smaller than the specified number is applicable.

Further, in the embodiments described below, it goes without saying that the components (including element steps) are not always indispensable unless clearly specified or except the case where the components are apparently indispensable in principle.

Similarly, in the embodiments described below, when the shape of the components, positional relation thereof, and the like are mentioned, the substantially approximate and similar shapes and the like are included therein unless clearly specified to the contrary or except the case where it can be conceived that they are apparently excluded in principle. This condition is also applicable to the numerical value and the range described above.

Also, the components having the same function are added by the same reference symbol in the entire drawings for describing the embodiments, and repetitive descriptions thereof are omitted.

Also, in the drawings used in the embodiments, the light-shielding members (light-shielding film, light-shielding pattern, light-shielding region, and the like) are hatched so as to make the drawings easy to see even in the plan view.

Hereinafter, the embodiments of the present invention will be described in detail based on the drawings.

(First Embodiment)

The method of manufacturing a semiconductor integrated circuit device according to the embodiment has been made in order to manufacture a desired semiconductor integrated circuit device by transferring a pattern of an IP mask (first photomask) onto a product mask (second photomask) using a reduced projection exposure apparatus, and then transferring the pattern of the product mask onto a wafer using the reduced projection exposure apparatus.

Figure 1:
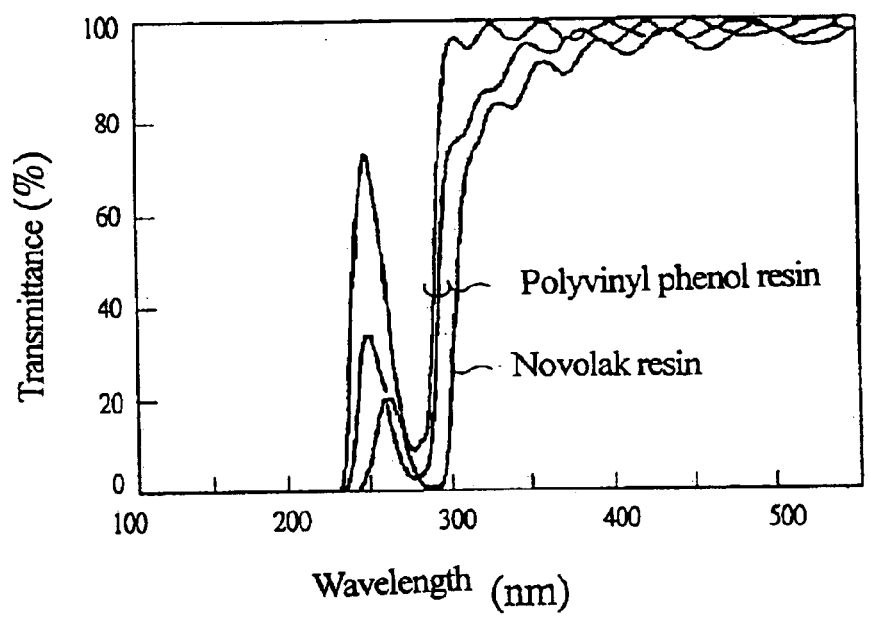
FIG. 1 is a graph showing light transmittance of resist films formed on a photomask used in a method of manufacturing a semiconductor integrated circuit device according to an embodiment of the present invention with respect to lights of various exposure wavelengths.

First, the IP mask used in this embodiment will be described. In this embodiment, the resist mask is used as the IP mask. The basic resist mask is a technology utilizing the property of an organic film such as a resist film, that is, a mask effect (light-reducing or light-shielding effect) to exposure light such as ArF excimer laser (wavelength: 193 nm). FIG. 1 shows a spectral transmittance of a standard electron beam resist film, for example, polyphenol resin or novolak resin used in the mask writing or the like. Also, in FIG. 1, the spectral transmittance in the case of setting the film thickness of the electron beam resist films as about 100 nm is exemplified. The electron beam resist films have light transmittance of about 0 for, for example, the light having the wavelength of about 150 to 230 nm. Therefore, it can be understood that the electron beam resist films have sufficient mask effect to, for example, ArF excimer laser having the wavelength of 193 nm, $F^2$ laser having the wavelength of 157 nm, and the like. Note that the mask using the resist film as a light-shielding member is disclosed in Japanese Patent Application Laid-Open No. 5-289307.

Next, an example of the IP mask used in this embodiment will be described with reference to FIGS. 2 to 5. FIGS. 2A, 3A, 4A, and 5A are general plan views of IP masks Mm1 to Mm4. FIGS. 2B, 3B, 4B, and 5B are cross-sectional views taken along the lines X1—X1, X2—X2, X3—X3, and X4—X4 of FIGS. 2A, 3A, 4A, and 5A, respectively. FIGS. 2C, 3C, 4C, and 5C are cross-sectional views of modification examples. Note that though FIGS. 2A, 3A, 4A, and 5A are plan views, the light-shielding members therein are hatched so as to make the drawings easy to see. In this case, the light-shielding member made of an organic film is hatched with thick lines and the light-shielding member made of metal is hatched with thin lines. Also, in FIGS. 2 to 5, the patterns of the IP masks Mm1 to Mm4 are schematically shown as the alphabet E so as to simplify the description. In an actual case, lines and a rectangular pattern for forming wiring and electrodes, a hole pattern for forming a thorough hole and a contact hole, and a pattern for forming a mask used in the impurity introduction are formed. In addition, in FIGS. 2 to 5, the cases where one integrated circuit pattern region CA is arranged on each of the IP masks Mm1 to Mm4 are exemplified. However, the arrangement of the integrated circuit pattern region CA is not limited to these, and a plurality of integrated circuit pattern regions CA may be arranged. Also, in FIGS. 2 to 5, the case where one integrated circuit pattern region CA corresponds to a forming region of one semiconductor chip (hereinafter, referred to as chip) is exemplified.

In the IP masks Mm1 to Mm4, for example, patterns four to five times as large as those of later-described product masks are formed. Since the patterns of the IP masks Mm1 to Mm 4 are four or five times as large as those of the product masks, high pattern forming accuracy and high dimensional precision can be achieved. Also, since variance in dimension can be reduced by the extent proportional to the reduction rate in the transfer of the pattern onto the product mask, the dimensional precision on the product mask can be made extremely high. In addition, the occurrence of the defects can be reduced. Accordingly, it becomes possible to manufacture the products requiring higher dimensional precision of the pattern. The magnification is set depending on that of the reduced projection exposure apparatus used to form the product mask, and is not particularly limited to that described above. A mask substrate 1 constituting each of the IP masks Mm1 to Mm4 is made of, for example, a transparent synthetic quartz glass substrate having a thickness of about 6 mm in the shape of a parallelogram.

The IP mask Mm1 of FIG. 2 exemplifies the case where light-shielding patterns 2 (2a, 2b, and 2c) on a first main surface of the mask substrate 1 are all constituted of organic films. The light-shielding patterns 2 have a characteristic of absorbing (light-shielding or light-reducing) exposure light such as g-beam (wavelength: 436 nm), i-beam (wavelength: 365 nm), KrF excimer laser (wavelength: 248 nm), ArF excimer laser (wavelength: 193 nm), and $F_2$ laser (wavelength: 157 nm). Also, the light-shielding patterns 2 have an approximately the same mask effect as a light-shielding member made of metal such as chromium. The light-shielding pattern 2a is a pattern for transferring the integrated circuit pattern onto the product mask and is arranged on a transparent region 3a of the integrated circuit pattern region CA in the central portion of the first main surface of the mask substrate 1. The light-shielding pattern 2b is a pattern for defining the area of the integrated circuit pattern region CA and is arranged in the peripheral region of the integrated circuit pattern region CA so as to edge the outer periphery of the same. In this IP mask Mm1, the light-shielding pattern 2b is formed in the stripe shape and the outer peripheral region thereof serves as a transparent region 3b. The light-shielding patterns 2c exemplified by a flat-cross shape arranged in the transparent region 3b serve as alignment marks used in aligning the two dimensional position between the IP mask Mm1 and the reduced projection exposure apparatus. A joint surface of a base of a pellicle is joined while being contacted to the mask substrate 1 in the outer periphery of the light-shielding pattern 2b. Therefore, the occurrence of problems such as the exfoliation of the pellicle and the generation of the foreign object at the time of detachment of the pellicle can be avoided.

Figure 2A:
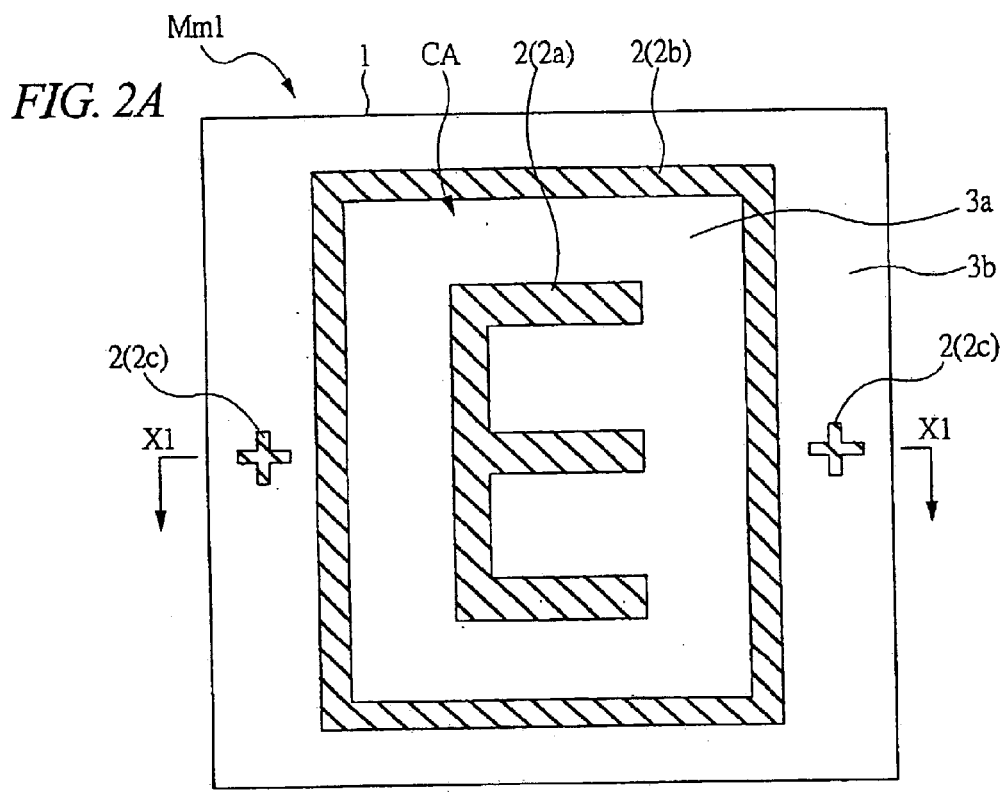
FIG. 2A is a plan view of the photomask used in the method of manufacturing a semiconductor integrated circuit device according to the embodiment of the present invention, FIG. 2B) is a cross-sectional view taken along the line X1—X1 of FIG. 2A.
Figure 2B:
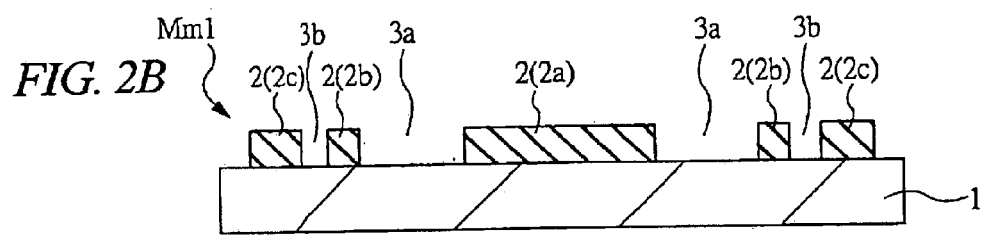
FIG. 2C is a cross-sectional view showing a structure of a modification example of FIG. 2B.

FIG. 2B exemplifies the case where the light-shielding patterns 2 are formed of a single film of the electron beam resist film. As a material of the electron beam resist film, a substance mainly made of, for example, copolymer of α-methylstyrene and α-chloroacrylic acid, novolak resin and quinone diazide, novolak resin and polymethylpentene-1-sulfone, and chloromethyl-polystyrene is used. A so-called chemical amplification resist made by mixing an inhibitor and an acid generator into phenol resin such as polyvinyl phenol resin or novolak resin is also used. Any substances can be used as the material of the light-shielding resist film used in this embodiment if they have a light-shielding property for a light source of the projection exposure apparatus and a photosensitivity to the light source of the pattern writing apparatus in the mask manufacturing process, that is, photosensitivity to the electron beam or the light having the wavelength of 230 nm or longer. Therefore, the material of the light-shielding resist film is not limited to the foregoing substances and various changes can be made therein. In the case where the polyphenol resin or novolak resin is deposited to the thickness of about 100 nm, since the light transmittance for the light having the wavelength of about 150 nm to 230 nm is almost 0, it can be understood that such resin has sufficient mask effect to, for example, the ArF excimer laser, F² laser, and the like. Although vacuum-ultraviolet light having the wavelength of 200 nm or shorter is employed as an object in this embodiment, the light used therein is not limited to this. The exposure light having the wavelength of longer than 200 nm such as g-beam, i-beam, and KrF excimer laser is also applicable thereto. In this case, it is necessary that other electron beam resist film material is used or that an absorbing member having a light-absorbing property to the exposure light or a light-shielding member having a light-shielding property to the exposure light is added to the resist film. By so doing, even if the light-shielding patterns 2 are formed of a single film of the electron beam resist film, the light-shielding patterns 2 can have a sufficient mask effect to the exposure light having the wavelength of 200 nm or longer, for example, g-beam, i-beam, and KrF excimer laser. Note that the technique for forming a light-shielding pattern by the use of an organic film is disclosed in Japanese Patent Application No. 11-185221 (filed on Jun. 30, 1999) by the inventors of this application.

Figure 2C:
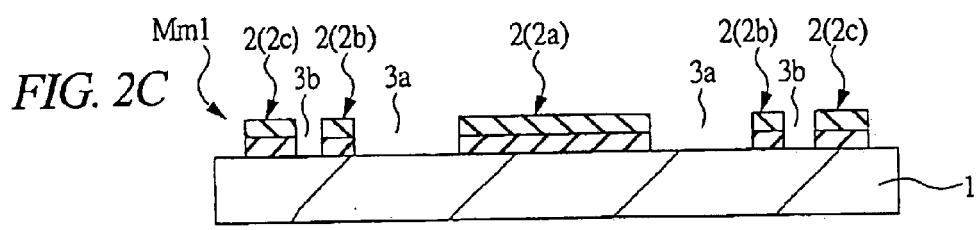

Also, exemplified in FIG. 2C is the case where the light-shielding patterns 2 are formed of a layered film made by depositing the electron beam resist film described in FIG. 2B on a light-absorbing organic film. The light-absorbing organic film is made of, for example, an antireflection film such as polyimide resin and is made of a material having a light-absorbing property, light-reducing property, or a light-shielding property to the exposure light having the wavelength of 200 nm or longer. Therefore, the light-shielding patterns 2 can have a sufficient mask effect to the exposure light having the wavelength of 200 nm or longer. The light-shielding pattern 2 having the layered structure as described above is manufactured in such a manner as follows. Firstly, a predetermined pattern is written using an electron beam on an electron beam resist film. Subsequently, development thereof is performed to form a resist pattern of the electron beam resist film. At this time, a light-absorbing organic film as a lower layer is patterned self-aligningly using the resist pattern as a mask. Note that a technique for forming a light-shielding film by the use of a layered film made of a light-absorbing organic film and a photosensitive organic film is disclosed in Japanese Patent Applications No. 2000-328159 and No. 2000-328160 (both filed on Oct. 27, 2000) by the inventors of this application.

Figure 3A:
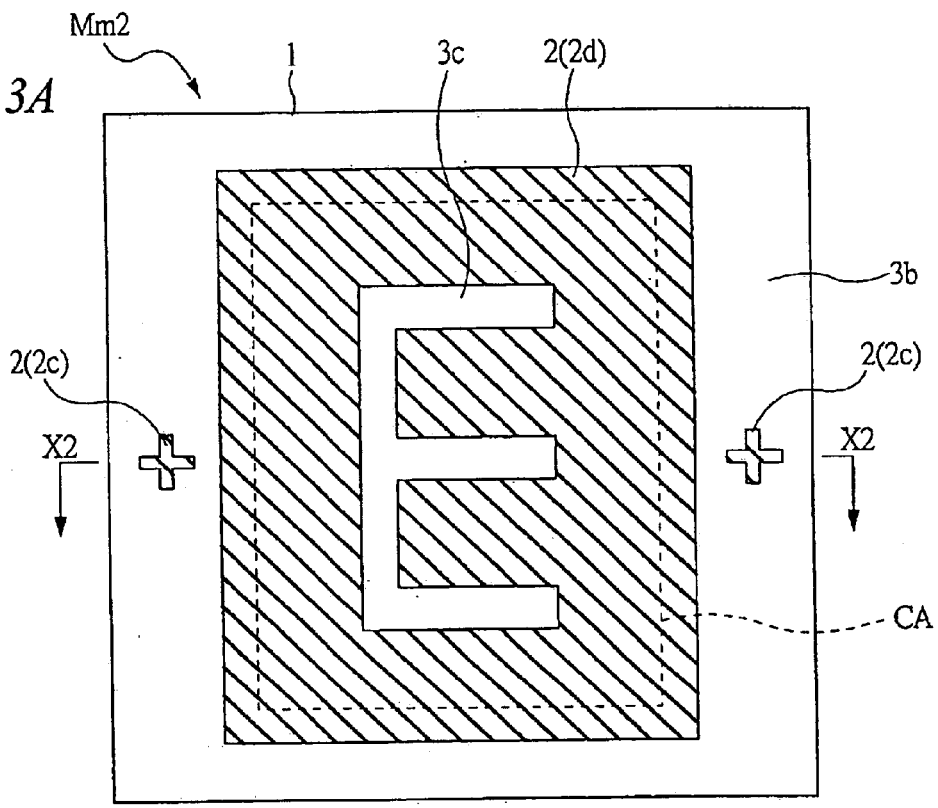
FIG. 3A is a plan view of another photomask used in the method of manufacturing a semiconductor integrated circuit device according to the embodiment of the present invention, 3B is a cross-sectional view taken along the line X2—X2 of FIG. 3A.
Figure 3B:
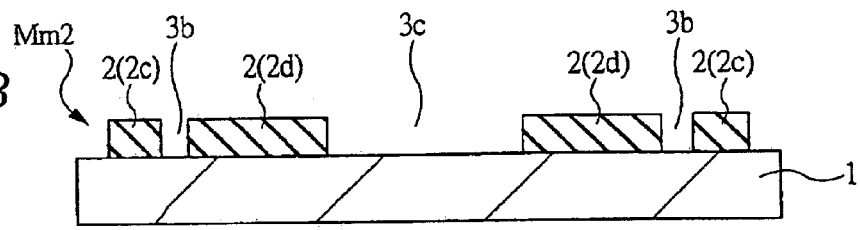
FIG. 3C is a cross-sectional view showing a structure of a modification example of FIG. 3B.
Figure 3C:
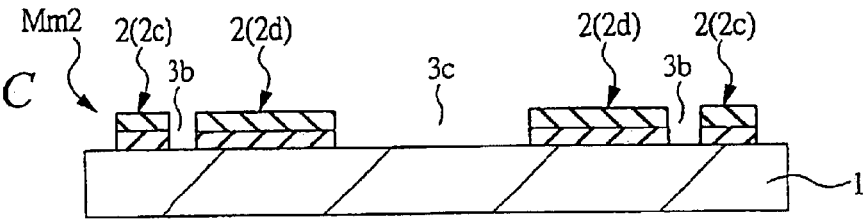

The IP mask Mm2 in FIG. 3 exemplifies the case where the light-shielding patterns 2 (2c and 2d) on the first main surface of the mask substrate 1 are all made of organic films, and the case where the arrangement of the transparent region and the light-shielding region is reversed in comparison to the IP mask Mm 1 in FIG. 2. A light-shielding pattern 2d is arranged at a central portion of the first main surface of the mask substrate 1 in this IP mask Mm2. The light-shielding pattern 2d is a pattern covering most of the integrated circuit pattern region CA and has an outer periphery protruding to the peripheral region. A transparent pattern 3c defined by the light-shielding pattern 2d is a pattern for transferring the integrated circuit pattern onto the product mask and is arranged in the integrated circuit pattern region CA at the central portion of the first main surface of the mask substrate 1. A joint surface of a base of a pellicle is joined while being contacted to the mask substrate 1 in the outer periphery of the light-shielding pattern 2d. FIG. 3B shows the case where the light-shielding patterns 2 (2c and 2d) are formed of a single film of the electron beam resist film similarly to the foregoing. FIG. 3C shows the case where the light-shielding patterns 2 (2c and 2d) are formed of a layered film constituted of the light-absorbing organic film and the electron beam resist film. Note that in order to transfer the patterns identical to each other onto a wafer using the IP masks Mm1 and Mm2, a positive resist film may be coated on the wafer when using the IP mask Mm1, and a negative resist film may be coated on the wafer when using the IP mask Mm2.

Figure 4A:
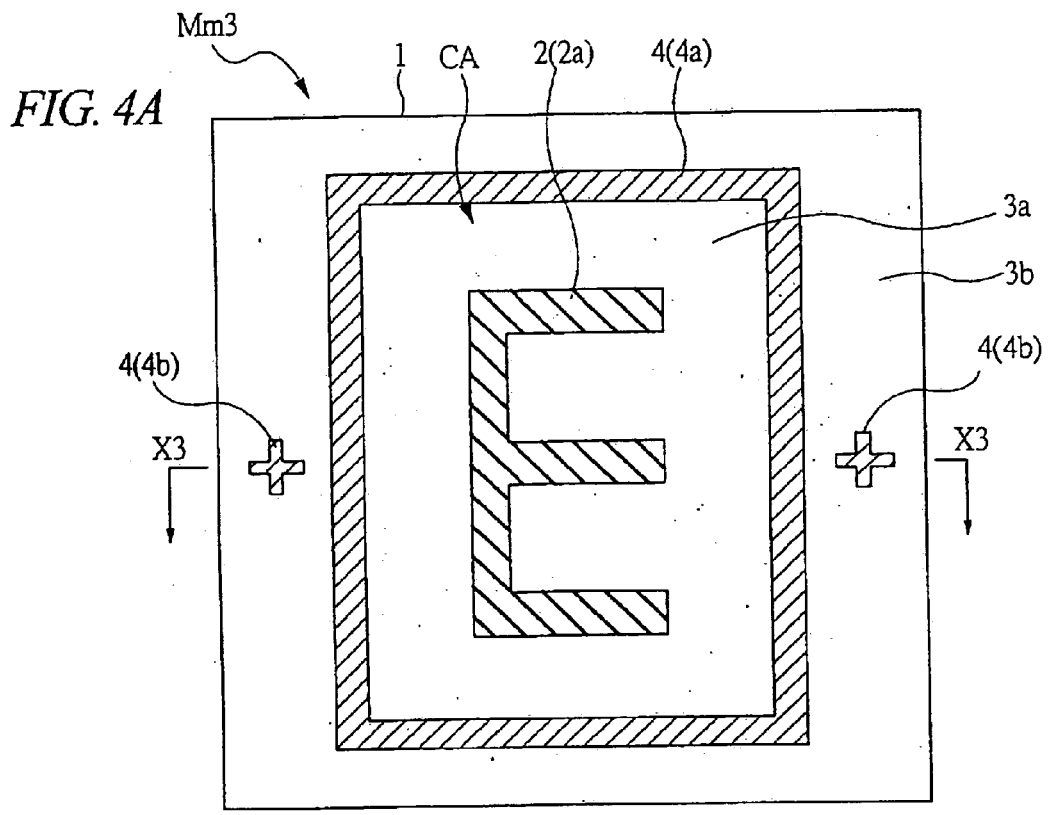
FIG. 4A is a plan view of another photomask used in the method of manufacturing a semiconductor integrated circuit device according to the embodiment of the present invention.
Figure 4B:
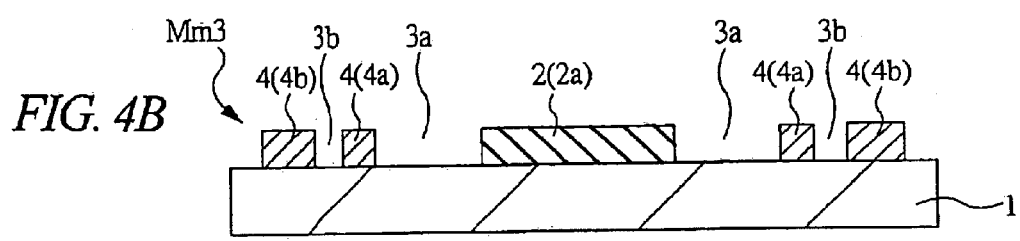
FIG. 4B is a cross-sectional view taken along the line X3—X3 of FIG. 4A.
Figure 4C:
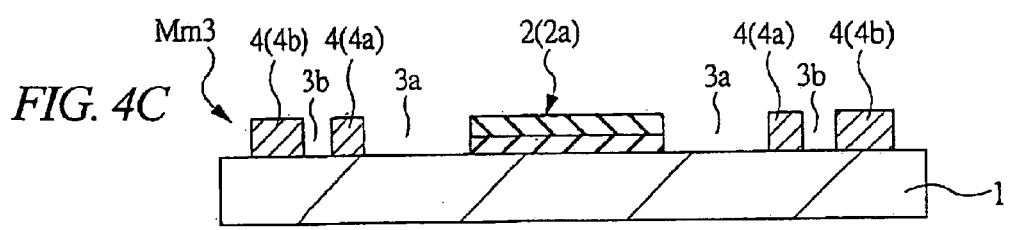
FIG. 4C is a cross-sectional view showing a structure of a modification example of FIG. 4B.

The IP mask Mm3 in FIG. 4 exemplifies the case where a light-shielding pattern 2 (2a) made of an organic film and a light-shielding patterns 4 (4a and 4b) made of metal are arranged on the first main surface of the mask substrate 1. In this IP mask Mm3, the light-shielding patterns 4a and 4b (They correspond to the light-shielding patterns 2b and 2c of the IP mask Mm1 of FIG. 2, respectively.) are made of, for example, a metal film such as a single film of chromium (Cr) or a layered film of chromium and chromium oxide ($CrO_x$). However, the material of the light-shielding pattern 4 is not limited to the chromium and the like, and various materials can be used. For example, refractory metal such as tungsten, molybdenum, tantalum, and titanium, nitride such as tungsten nitride, refractory metal silicide (compound) such as tungsten silicide ($WSi_x$) and molybdenum silicide ($MoSi_x$), or a layered film thereof can be used. With respect to the resist mask, the mask substrate 1 thereof is washed and used again (reproduction) in some cases after removing the light-shielding pattern 2 made of an organic film. Therefore, the refractory metal such as tungsten is preferable for the material of the light-shielding pattern 4 because the refractory metal has high oxidation resistance, high abrasion resistance, and high exfoliation resistance. The light-shielding patterns 4b exemplified by a flat-cross shape serve as alignment marks used in aligning the two dimensional position between the IP mask Mm3 and the reduced projection exposure apparatus. Since the alignment mark is constituted of metal, sufficient light-shielding effect can be obtained even in the case where helium-neon (He—Ne) gas laser having the wavelength of 633 nm is used as the light source for the alignment. Also, contrast between the light-shielding region and the transparent region can be obtained sufficiently. Therefore, position detection can be performed accurately and the pattern transfer accuracy can be improved. A joint surface of a base of a pellicle is joined while being contacted to the mask substrate 1 in the outer periphery of the light-shielding pattern 4a. FIG. 4B shows the case where the light-shielding pattern 2 (2a) is formed of a single film of the electron beam resist film similarly to the foregoing. FIG. 4C shows the case where the light-shielding pattern 2 (2a) is formed of a layered film constituted of the light-absorbing organic film and the electron beam resist film. In this IP mask Mm3, the amount of time to manufacture the mask can be reduced in comparison to the IP masks Mm1 and Mm2 shown in FIGS. 2 and 3 because the light-shielding patterns 4a and 4b in the peripheral region are not required to be exposed in the reproduction. Note that also in this IP mask Mm3 having a structure like this, the patterns in the integrated circuit pattern regions can be reversed similarly to the case described in FIG. 3. In addition, the reproduction technique of the resist mask is disclosed in, for example, Japanese Patent Application No. 2000-246506 (filed on Aug. 15, 2000) by the inventors of this application.

Figure 5A:
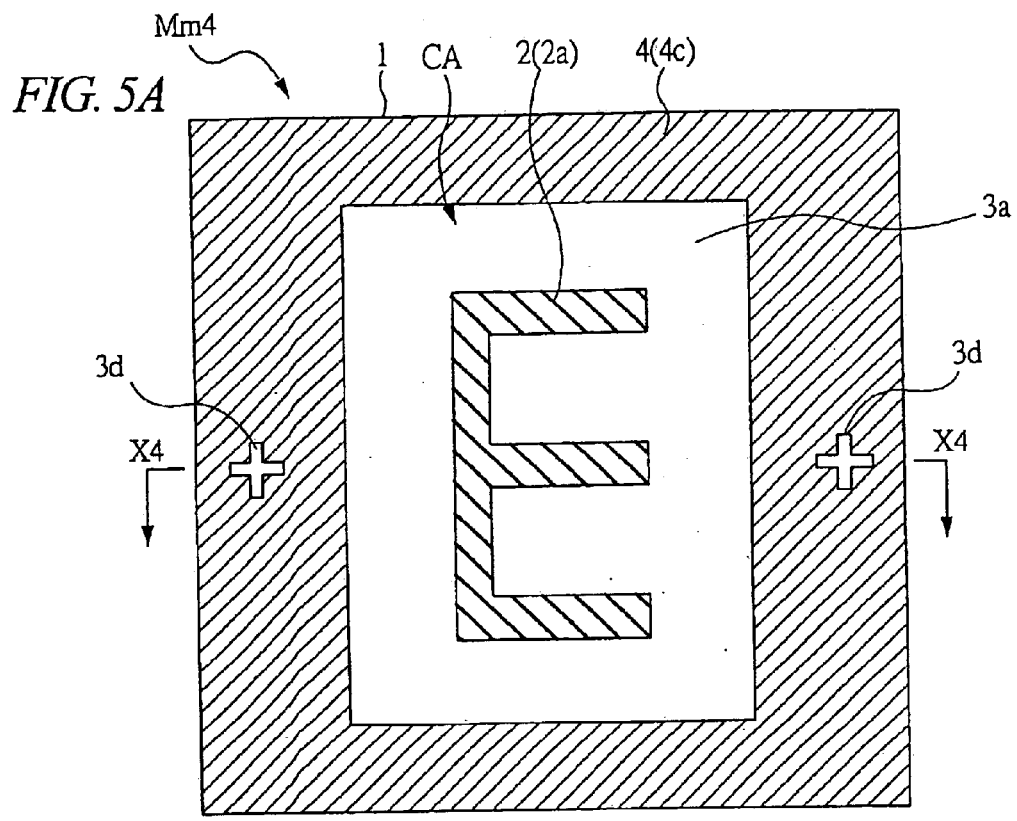
FIG. 5A is a plan view of another photomask used in the method of manufacturing a semiconductor integrated circuit device according to the embodiment of the present invention, 5B is a cross-sectional view taken along the line X4—X4 of FIG. 5A.
Figure 5B:
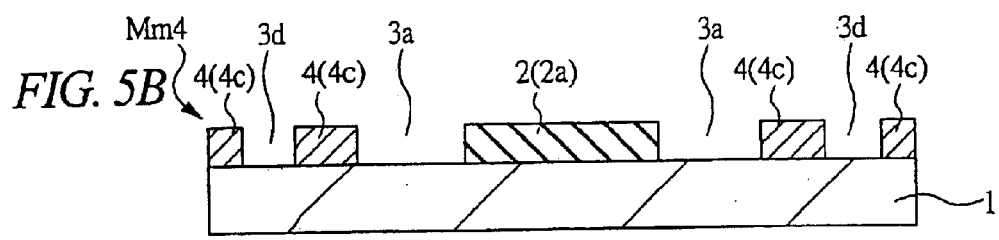
FIG. 5C is a cross-sectional view showing a structure of a modification example of FIG. 5B.
Figure 5C:
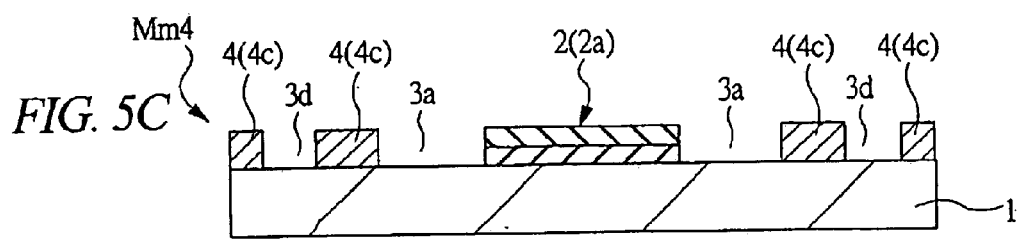

The IP mask Mm4 in FIG. 5 exemplifies the case where the light-shielding pattern 4c made of metal covers most of the peripheral region on the first main surface of the mask substrate 1. The light-shielding pattern 4c is made of the same metal as the light-shielding pattern 4a described above. The fine transparent patterns 3d exemplified by the flat-cross shape defined by the light-shielding pattern 4c are formed in parts of the light-shielding pattern 4c. The transparent patterns 3d serve as alignment marks used in the two-dimensional alignment between the IP mask Mm4 and the reduced projection exposure apparatus. Also in this case, a sufficient light-shielding effect can be obtained when helium-neon gas laser having the wavelength of 633 nm is used as the light source for the alignment. Also, contrast between the light-shielding region and the transparent region can be obtained sufficiently. Therefore, position detection can be performed accurately and the pattern transfer accuracy can be improved. A joint surface of a base of a pellicle is joined while being contacted to the light-shielding pattern 4c. FIG. 5B shows the case where the light-shielding pattern 2 (2a) is formed of a single film of the electron beam resist film similarly to the foregoing. FIG. 5C shows the case where the light-shielding pattern 2 (2a) is formed of a layered film of the light-absorbing organic film and the electron beam resist film. Note that also in this IP mask Mm4 having a structure like this, the patterns in the integrated circuit pattern regions can be reversed similarly to the case described in FIG. 3.

In the case where the IP mask is constituted of the resist mask as described above, the advantages as follows can be obtained.

First, a development period and a manufacturing time of the semiconductor integrated circuit device can be reduced. Since the IP mask is used only once or not more than a few times (especially, in a customized product), taking much time to manufacture the IP mask causes the waste of time. To the contrary, in the IP mask of this embodiment, since the light-shielding pattern is constituted of an organic film, the necessity of the etching process for the metal film can be removed in the formation of the mask pattern. Therefore, the amount of time required to manufacture the IP mask is greatly reduced in comparison to the case of the normal mask.

Second, since the dimensional precision of the pattern to be transferred onto the product mask (or onto a wafer) can be improved, the improvement in performance and integration of the semiconductor integrated circuit device can be achieved. The reason therefor is as follows. Since the etching of the metal film is not performed, but the organic film is patterned by the exposure and the development to form the mask pattern in the IP mask of this embodiment, the occurrence of the dimensional error caused by the etching to form the mask pattern can be prevented.

Third, the IP mask having high reliability can be manufactured with low defect rate. The reason therefor is as follows. Since the etching is not performed in the pattern formation, the occurrence of the defects is greatly reduced.

Fourth, since the manufacturing cost of the mask (broader concept including IP mask and product mask) can be reduced, the cost of the semiconductor integrated circuit device can be reduced. The reason therefor is as follows. In addition that the above-described third advantage can be obtained, since the light-shielding pattern is constituted of an organic film in the IP mask of this embodiment, the etching step of the metal film in the formation of the mask pattern can be omitted, and thus the material cost, the fuel cost, and the equipment cost required to perform the etching can be saved. Also, the mask substrate can be recycled by removing the light-shielding pattern made of an organic film. Since the IP mask is used only once or a few times (especially, in a customized product), this advantage is quite effective to achieve the cost reduction of the semiconductor integrated circuit device.

In the case of the resist mask as described above, there is a possibility that the film quality and the light transmittance to the irradiation of the exposure light are changed. However, since the IP mask is used for the exposure only once or a few times, the resist mask has a sufficient resistance to the exposure of this extent even if the resist mask is used as the IP mask. Therefore, the change of the film quality and the light transmittance is small enough to be ignored.

Figure 6A:
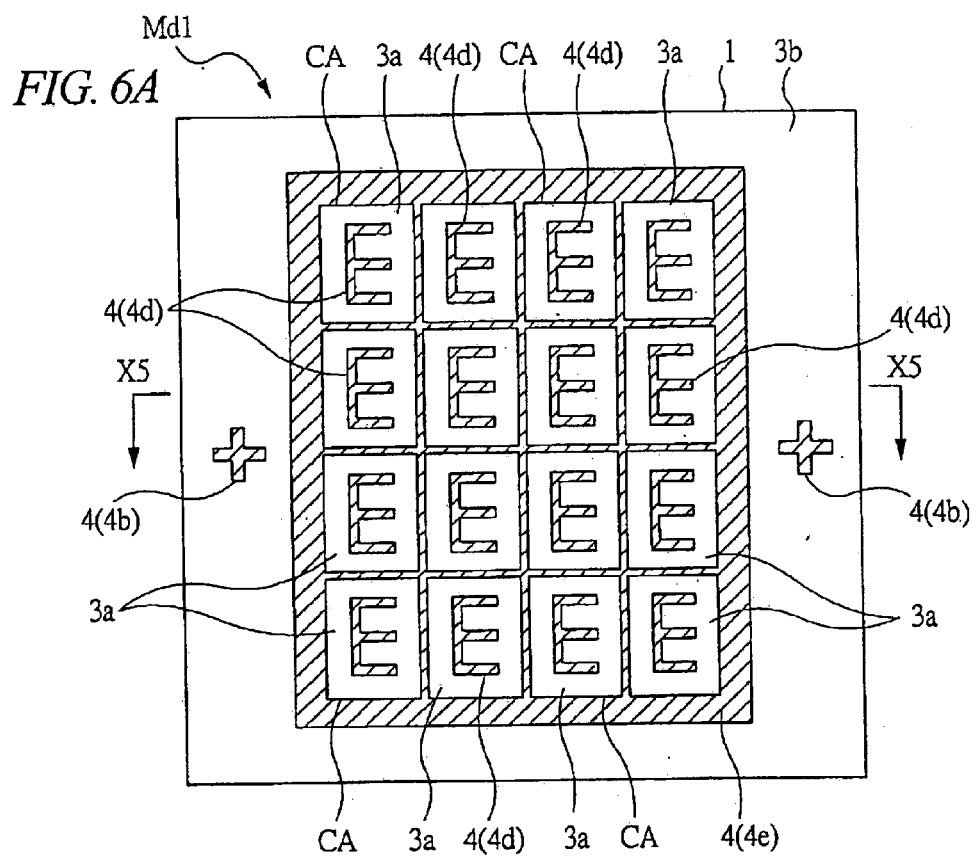
FIG. 6A is a plan view of another photomask used in the method of manufacturing a semiconductor integrated circuit device according to the embodiment of the present invention.

Next, description will be made for the product mask. FIGS. 6 to 8 show an example thereof. The planar, entire dimensions of product masks Md1 to Md3 are almost the same as those of the IP masks Mm1 to Mm4. In FIGS. 6 to 8, the case where the magnification is set to four times is exemplified. Specifically, 16 integrated circuit pattern regions CA (obtained by 4×4=16) are arranged. Since the product masks Md1 to Md3 are manufactured using the IP masks Mm1 to Mm4, each pattern of the integrated circuit pattern regions CA is schematically shown as the alphabet E in conformity to the IP masks Mm1 to Mm 4. Also in this case, one integrated circuit pattern region CA corresponds to a forming region of one chip. Although FIGS. 6A, 7A, and 8A are plan views, the light-shielding members therein are hatched so as to make the drawings easy to see. In this case, the light-shielding member made of an organic film is hatched with thick lines and the light-shielding member made of metal is hatched with thin lines.

Figure 6B:
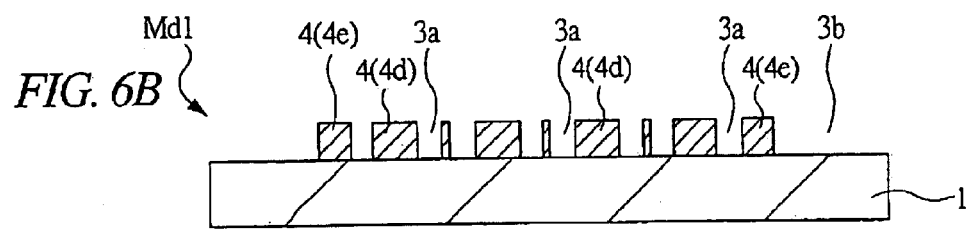
FIG. 6B is a cross-sectional view taken along the line X5—X5 of FIG. 6A.
Figure 7A:
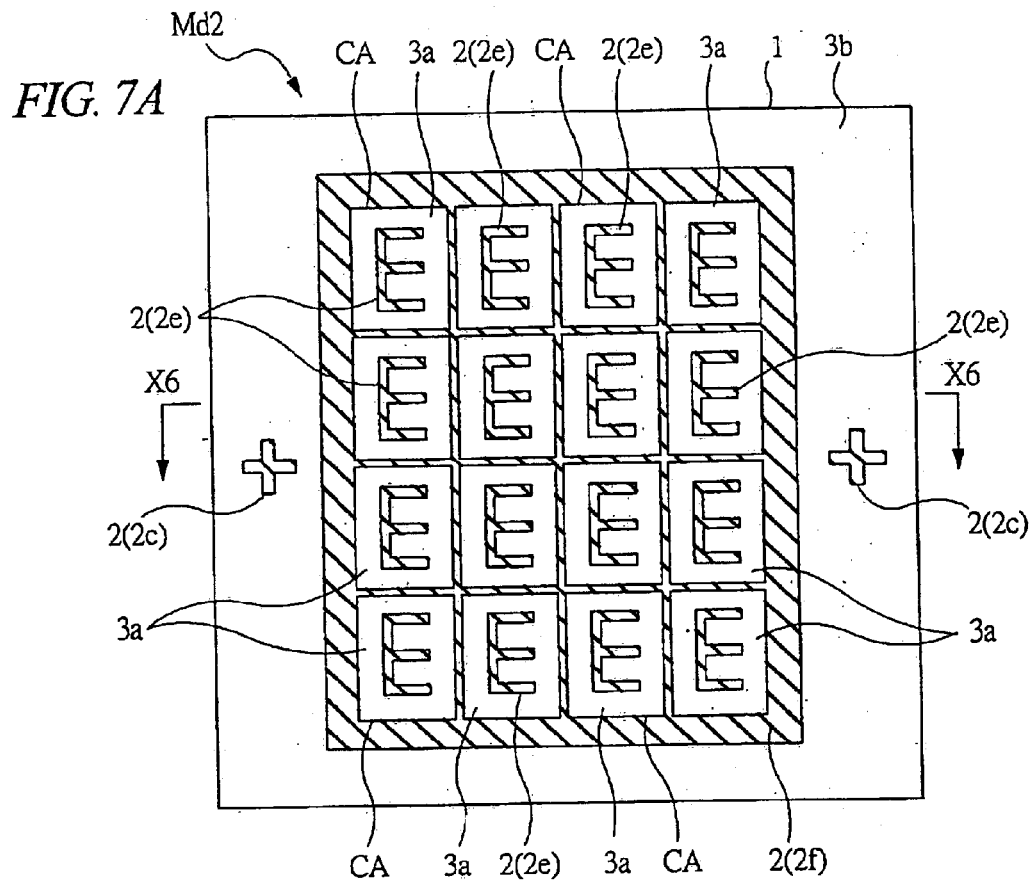
FIG. 7A is a plan view of another photomask used in the method of manufacturing a semiconductor integrated circuit device according to the embodiment of the present invention.

FIG. 6A is a general plan view of the product mask Md1 and FIG. 6B is a cross-sectional view taken along the line X5—X5 of FIG. 6A. The product mask Md1 is constituted of the normal mask. Specifically, light-shielding patterns 4(4b, 4d, and 4e) on the first main surface of the mask substrate 1 are constituted of, for example, a single film of chromium or a layered film of chromium and chromium oxide laminated thereon. The light-shielding pattern 4d is a pattern made by transferring the light-shielding pattern 2a or the transparent pattern 3c of the IP masks Mm1 to Mm4 and is a pattern for transferring the integrated circuit pattern onto a wafer. The light-shielding pattern 4d is arranged in each of the transparent regions 3a of the integrated circuit pattern region CA. The patterns in the integrated circuit pattern regions CA can be reversed similarly to the case described in FIG. 3. The light-shielding pattern 4e is a pattern defining an area of the integrated circuit pattern region CA and is arranged so as to edge the outer periphery of the integrated circuit pattern region CA. Also, in the case of the product mask Md1, the peripheral region of the mask substrate 1 can be designed to have a structure as shown in FIG. 5.

In the product mask Md1 described above, a joint surface of a base of a pellicle is joined while being contacted to the mask substrate 1 in the outer periphery of the light-shielding pattern 4e. Since the number of use of the product mask Md1 is larger than that of the IP mask, it is effective in terms of the improvement of the durability (lifetime) of the product mask Md1 to use the normal mask as the product mask Md1.

Figure 7B:
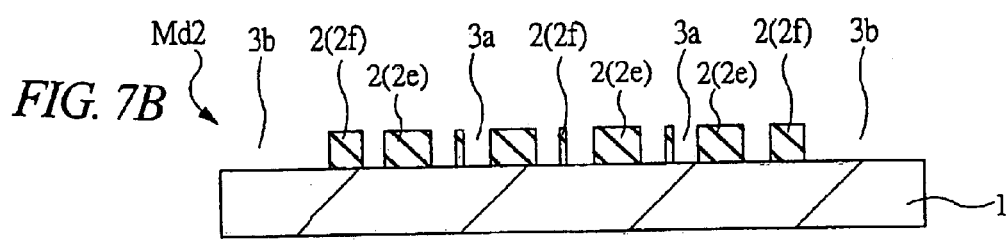
FIG. 7B is a cross-sectional view taken along the line X6—X6 of FIG. 7A.
Figure 7C:
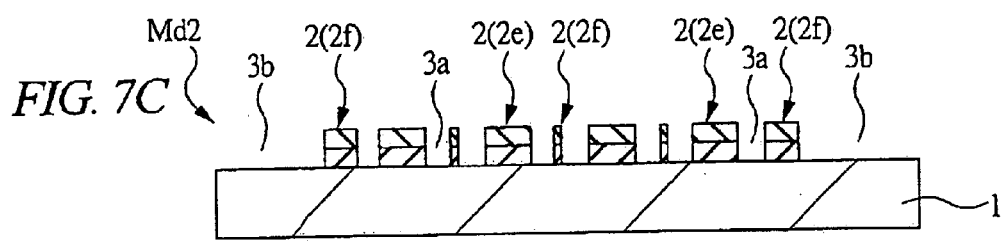
FIG. 7C is a cross-sectional view showing a structure of a modification example of FIG. 7B.
Figure 8A:
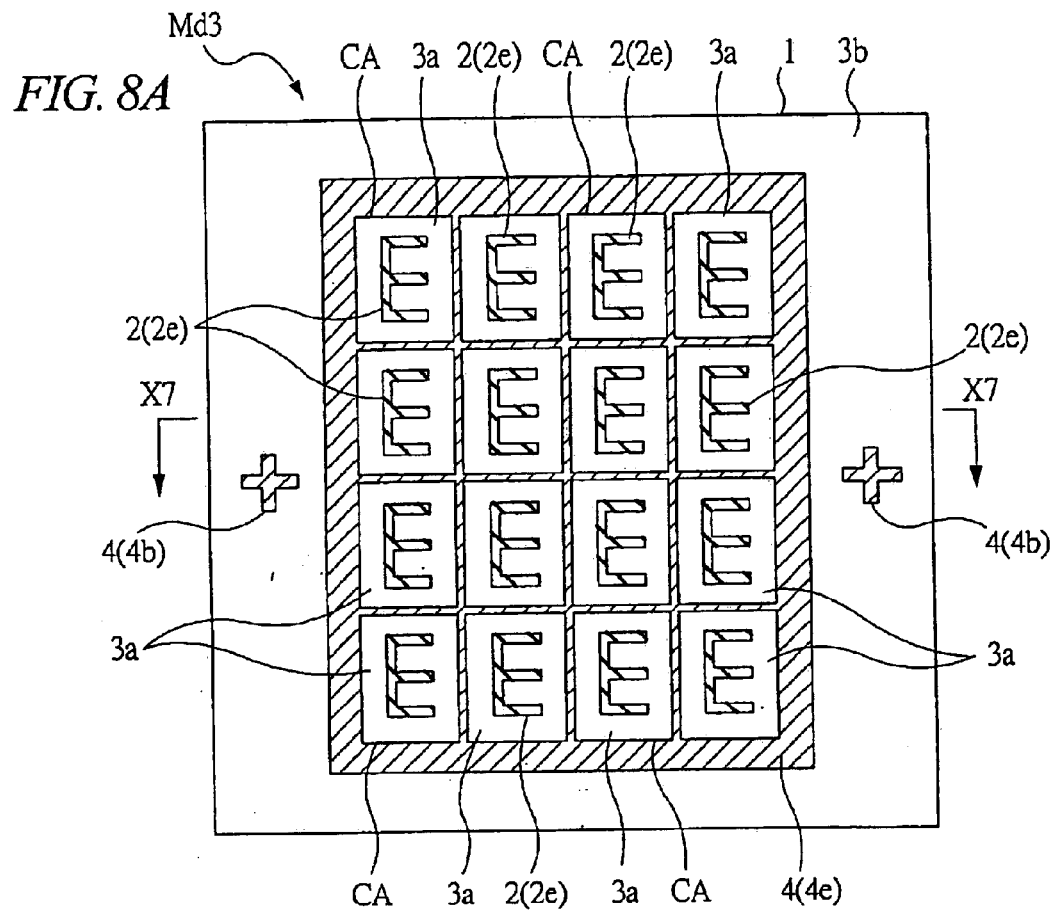
FIG. 8A is a plan view of another photomask used in the method of manufacturing a semiconductor integrated circuit device according to the embodiment of the present invention.

FIG. 7A is a general plan view of a product mask Md2, and FIG. 7B is a cross-sectional view taken along the line X6—X6 of FIG. 7A. This product mask Md2 is constituted of the resist mask. Specifically, the light-shielding patterns 2 (2c, 2e, and 2f) on the first main surface of the mask substrate 1 are constituted of the organic films. The light-shielding pattern 2e is a pattern made by transferring the light-shielding pattern 2a or the transparent pattern 3c of the IP masks Mm1 to Mm4 and is a pattern for transferring the integrated circuit pattern onto a wafer. The light-shielding pattern 2e is arranged in each of the transparent regions 3a of the integrated circuit pattern region CA. The patterns in the integrated circuit pattern regions CA can be reversed similarly to the case described in FIG. 3. The light-shielding pattern 2*f* is a pattern defining an area of the integrated circuit pattern region CA and is arranged so as to edge the outer periphery of the integrated circuit pattern region CA. In the product mask Md2 described above, a joint surface of a base of a pellicle is joined while being contacted to the mask substrate 1 in the outer periphery of the light-shielding pattern 2*f*. FIG. 7B shows the case where the light-shielding patterns 2 of the product mask Md2 are constituted of a single film of the electron beam resist film. FIG. 7C shows the case where the light-shielding patterns 2 of the product mask Md2 are constituted of a layered film of the light-absorbing organic film and the electron beam resist film.

In the product mask Md2 as described above, it becomes possible to further enhance the first and second advantages obtained by using the IP mask as the resist mask. Specifically, the development period and the manufacturing time of the semiconductor integrated circuit device can be further reduced. In addition, since the dimensional precision of the pattern transferred onto the product mask (or onto a wafer) can be further improved, the further improvement in performance and integration of the semiconductor integrated circuit device can be achieved. Also, the product mask having high reliability can be manufactured with low defect rate. Moreover, since the mask cost (broader concept including IP mask and product mask) can be further reduced, the cost of the semiconductor integrated circuit device can be further reduced.

Figure 8B:
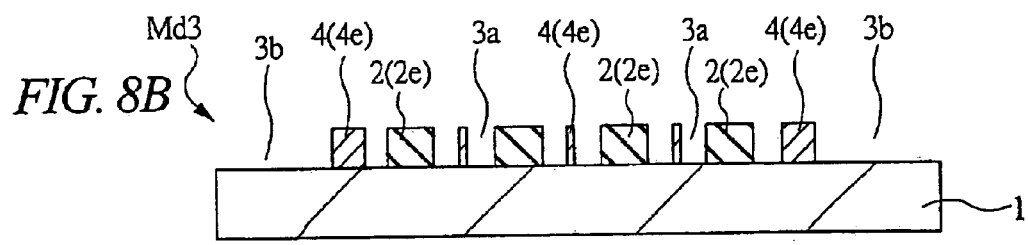
FIG. 8B is a cross-sectional view taken along the line X7—X7 of FIG. 8A.
Figure 8C:
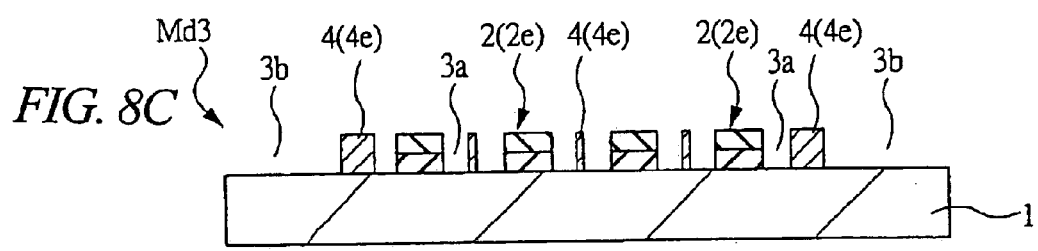
FIG. 8C is a cross-sectional view showing a structure of a modification example of FIG. 8B.

FIG. 8A is a general plan view of the product mask Md3. FIG. 8B is a cross-sectional view taken along the line X7—X7 of FIG. 8A. The product mask Md3 exemplifies the case where the light-shielding pattern 2 (2*e*) made of an organic film and the light-shielding patterns 4 (4*b* and 4*d*) made of metal are arranged on the first main surface of the mask substrate 1. In this product mask Md3, the light-shielding patterns 4*b* and 4*e* (They correspond to the light-shielding patterns 2*c* and 2*f* of the product mask Md2 of FIG. 7, respectively.) are constituted of, for example, a metal film such as a single film of chromium and a layered film of chromium and chromium oxide. Note that similarly to the case described in FIG. 4, the material of the light-shielding pattern 4 in this case may be selected from the refractory metal, the nitride, refractory metal silicide (compound) and a layered film thereof. With respect to the resist mask, especially, the mask substrate 1 thereof is washed and used again (reproduction) in some cases after removing the light-shielding pattern 2 made of an organic film. Therefore, the refractory metal is preferable for the material of the light-shielding pattern 4 because the refractory metal has high oxidation resistance, high abrasion resistance, and high exfoliation resistance. Also in this product mask Md3 having a structure like this, the patterns in the integrated circuit pattern regions can be reversed similarly to the cases described in FIG. 3. In the product mask Md3 described above, a joint surface of a base of a pellicle is joined while being contacted to the mask substrate 1 in the outer periphery of the light-shielding pattern 4*e*. Similar to the foregoing, FIG. 8B shows the case where the light-shielding pattern 2 (2*e*) is constituted of a single film of the electron beam resist film. FIG. 8C shows the case where the light-shielding pattern 2 (2*e*) is constituted of a layered film of the light-absorbing organic film and the electron beam resist film.

In this product mask Md3, in addition to the advantages obtained by using the product mask Md2 shown in FIG. 7, an advantage of reducing the manufacturing time of the mask can be obtained because it is not necessary to exposure the light-shielding patterns 4*b* and 4*e* in the peripheral region in the reproduction in comparison to the product mask Md2 of FIG. 7.

Figure 9A:
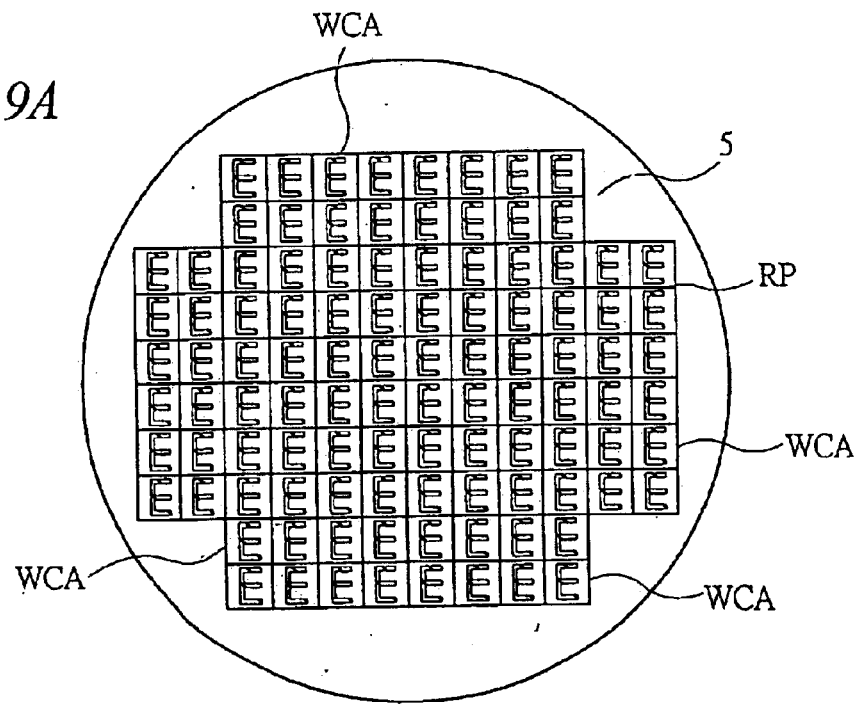
FIG. 9A is a plan view of a semiconductor wafer in the manufacturing process of the semiconductor integrated circuit device according to the embodiment of the present invention.
Figure 9B:
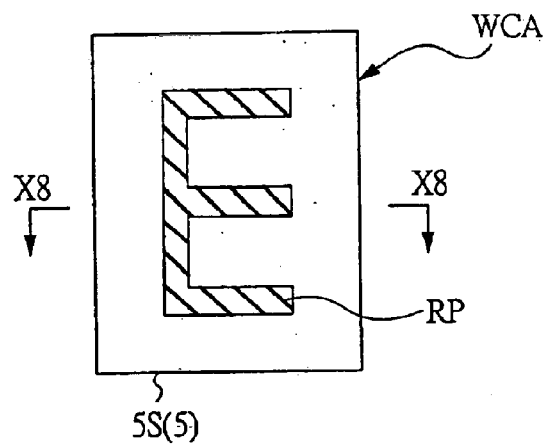
FIG. 9B is an enlarged plan view of a semiconductor chip forming region of the semiconductor wafer of FIG. 9A.
Figure 9C:
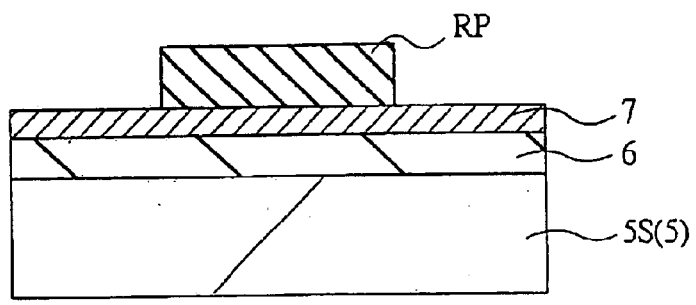
FIG. 9C is a cross-sectional view taken along the line X8—X8 of FIG. 9B.

FIG. 9 exemplifies a pattern transferred onto a wafer 5 by the reduced projection exposure using the product masks Md1 to Md3 described above. FIG. 9A is a general plan view of the wafer 5, FIG. 9B is an enlarged plan view of a chip forming region WCA of FIG. 9A, and FIG. 9C is a cross-sectional view taken along the line X8—X8 of FIG. 9B. Although FIGS. 9A and 9B are plan views, the components shown therein are hatched so as to make them easy to see.

A semiconductor substrate 5S of the wafer 5 is made of, for example, semiconductor such as single crystal silicon (Si) and predetermined integrated circuit devices are formed on a device surface (main surface) thereof. A plurality of chip forming regions WCA are arranged on the device surface of the wafer 5. A resist pattern RP transferred by the exposure using the product masks Md1 to Md3 is transferred onto each of the chip forming regions WCA. In this example, the case where an insulating film 6 made of, for example, silicon oxide is deposited on the device surface of the semiconductor substrate 5S and a metal film 7 made of, for example, aluminum or aluminum alloy is deposited thereon is exemplified. The resist pattern RP is formed on the metal film 7.

Figure 10:
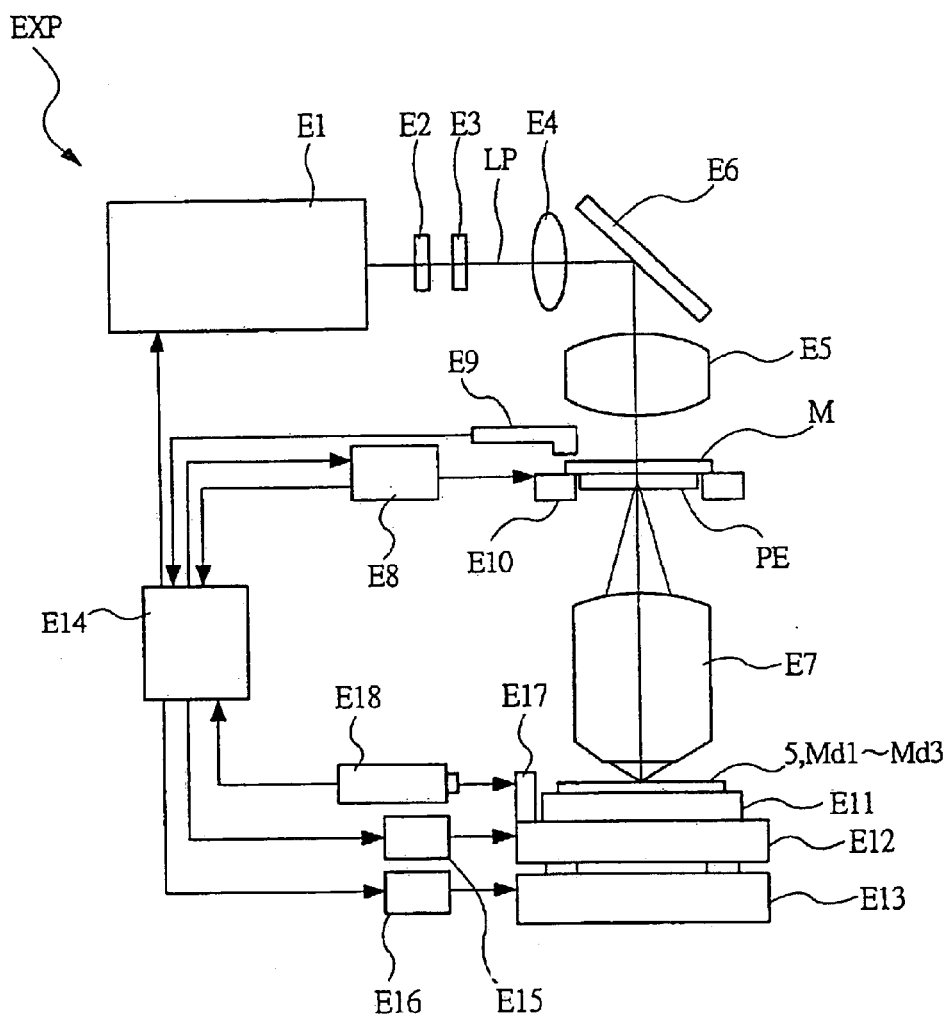
FIG. 10 is an explanatory diagram of an example of an exposure apparatus used in the method of manufacturing a semiconductor integrated circuit device according to the embodiments of the present invention.

Next, an example of the reduced projection exposure apparatus used in the manufacturing of the product masks Md1 to Md3 and in the transfer step of the resist pattern PR onto the wafer 5 will be described based on FIG. 10. Note that only the constituents necessary to describe the function of the exposure apparatus are shown in FIG. 10. However, other constituents essential to the ordinary exposure apparatuses (scanner and stepper) are similar to those within a usual scope.

An exposure apparatus EXP shown in FIG. 10 is, for example, a scanning type reduced projection exposure apparatus (scanner) having a reduction rate of 4:1. The exposure condition of the exposure apparatus EXP is as follows. Specifically, KrF excimer laser having the exposure wavelength of about 248 nm is used as exposure light Lp, numerical aperture NA of an optical lens is set to 0.65, a shape of illumination is round, and a coherency value (σ: sigma) is set to 0.7. As a mask M, any one of the IP masks Mm1 to Mm4 and the product masks Md1 to Md3 is used. However, the exposure light Lp is not limited to the foregoing and various modifications can be made thereto. For example, g-beam, i-beam, ArF excimer laser, or $F_2$ gas laser may be used.

Light emitted from an exposure light source E1 transmits through a fly eye lens E2, an aperture E3, a condenser lenses E4 and E5, and a mirror E6 to illuminate the mask M (a reticle in this case). Among the optical conditions, the coherency is controlled by adjusting the size of the aperture E3. A pellicle PE is provided on the mask M so as to prevent a pattern transfer failure due to adhesion of foreign matters. A mask pattern written on the mask M is projected via a projection lens E7 onto the product masks Md1 to Md3 or the wafer 5 serving as a process substrate. The mask M is placed on a mask stage E10 controlled by mask position control means E8 and a mirror E9, and the mask center and the optical axis of the projection lens E7 are accurately aligned.

The product masks Md1 to Md3 or the wafer 5 is put on a sample stage E11 by vacuum suction. The sample stage E11 is mounted on a Z stage E12, which is movable in the vertical direction (Z direction) to a substrate placing surface of the sample stage E11. Further, the Z stage E12 is mounted on an XY stage E13, which is movable in the horizontal direction to the substrate placing surface of the sample stage E11. The Z stage E12 and the XY stage E13 are driven by drive means E15 and E16, respectively, in response to control commands sent from a main control system E14. Therefore, the sample stage E11 can be moved to any desired exposure position. The position of the sample stage E11 is correctly monitored by a laser measuring device E18 as a position of a mirror E17 fixed to the Z stage E13. Also, the surface position of the product masks Md1 to Md3 or the wafer 5 is measured by focus position detection means provided in the normal exposure apparatus. The Z stage E12 is driven according to the measurement, thereby enabling the surface of the wafer 5 to always align the image forming surface of the projection lens E7.

The mask M is driven synchronously with the product masks Md1 to Md3 or the wafer 5 depending on the reduction rate, and while the exposure region scans on the mask M, the mask pattern is reduced and transferred onto the product masks Md1 to Md3 or the wafer 5. At this time, the surface position of the product masks Md1 to Md3 or the wafer 5 is also driven dynamically relative to the scanning of the product masks Md1 to Md3 or the wafer 5 by the above-described drive means. When the circuit pattern on the mask M is aligned to the circuit pattern formed on the wafer 5 to perform the exposure, a position of a mark pattern formed on the wafer 5 is detected using an alignment detection optical system and the wafer 5 is aligned according to the detection, and then the circuit pattern on the mask M is transferred. The main control system E14 is electrically connected to a network apparatus, which enables the remote monitoring of the state of the exposure apparatus EXP.

According to this embodiment, improvement in the mask accuracy can be achieved. Consequently, the irregularity of the pattern can be reduced by about 40%. Thus, the operation speed of the chip can be increased, and high value-added device chips can be manufactured with low defect rate. Also, since the variance in dimensions on the wafer resulting from the variance in dimensions of the mask can also be reduced, the defect rate in the manufacturing process of a product can be reduced to two-thirds.

(Second Embodiment)

Figure 11:
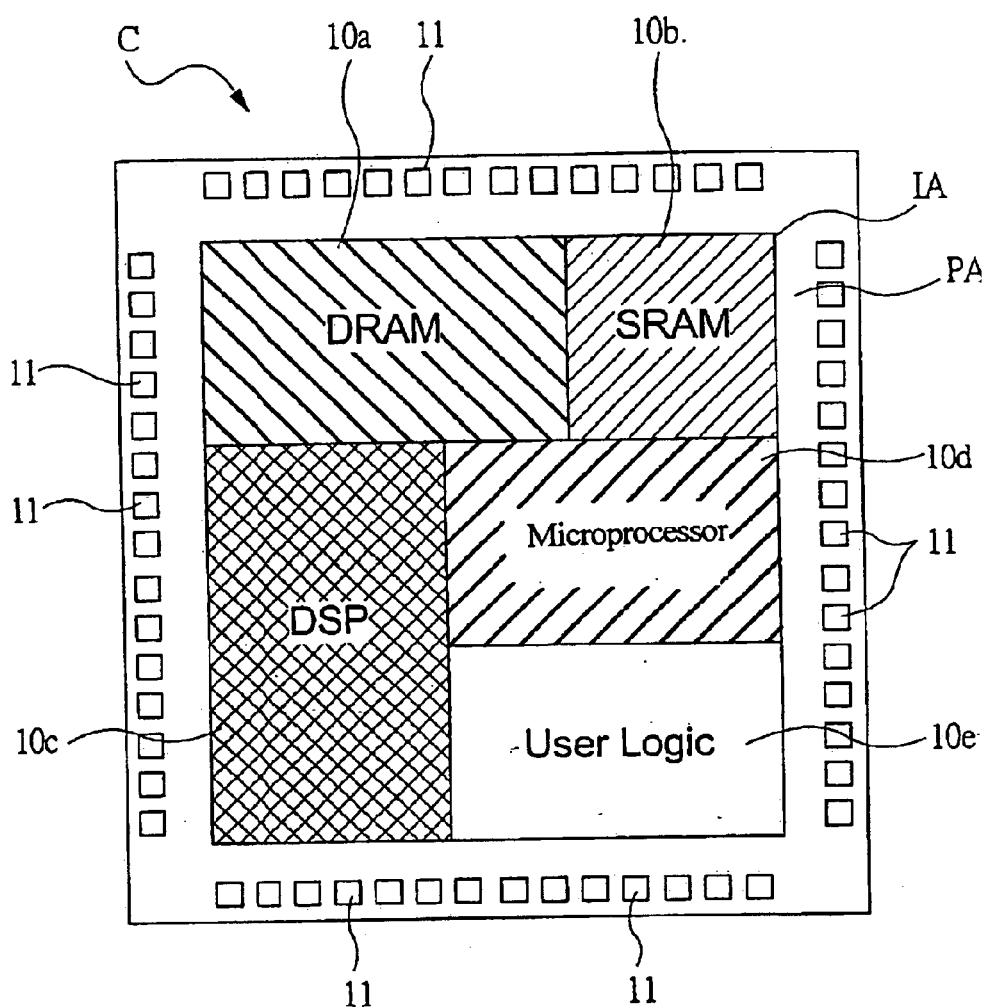
FIG. 11 is a general plan view of an example of a semiconductor chip constituting the semiconductor integrated circuit device according to another embodiment of the present invention.

In this second embodiment, the case where the present invention is applied to the method of manufacturing a mixed device such as a system LSI will be described. FIG. 11 is a general plan view schematically showing a chip 5C, which exemplifies the system LSI. Note that circuit regions in FIG. 11 are hatched so as to distinguish the circuit regions from each other.

The chip 5C is obtained by cutting the chip forming region WCA (refer to FIG. 9) of the wafer 5 described in the first embodiment. A plurality of circuit regions 10a to 10e are arranged in an inner circuit region IA at the center of the device surface (main surface) of the chip 5C. In this example, the circuit region 10a shows a region where DRAM (Dynamic Random Access Memory) is formed, the circuit region 10b shows a region where SRAM (Static Random Access Memory) is formed, the circuit region 10c shows a region where DSP (Digital Signal Processor) is formed, the circuit region 10d shows a region where a microprocessor is formed, and the circuit region 10e shows a region where a user logic is formed. In an outer peripheral region PA of the inner circuit region IA, input/output circuits (input circuit, output circuit and bidirectional circuit) and a plurality of outer terminals 11 are arranged. The outer terminal 11 serves as an electrode for drawing out an electrode of the integrated circuit formed in the inner circuit region IA, and a bonding wire, a bump electrode or the like is connected to the outer terminal 11.

Figure 12:
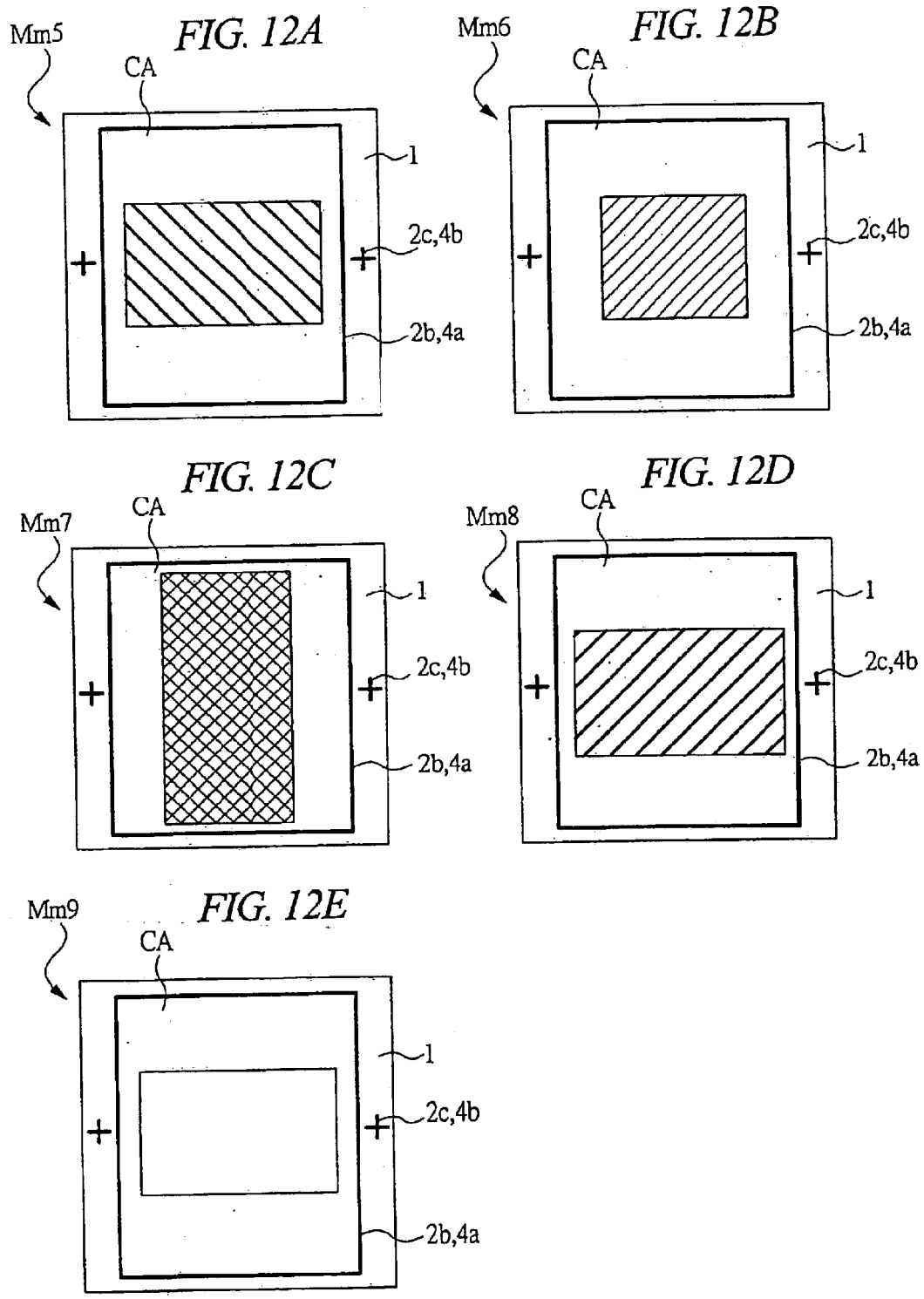
FIG. 12A to FIG. 12E are general plan views of examples of the photomasks used for manufacturing the semiconductor integrated circuit device of FIG. 11, namely.

IP masks used for manufacturing the mixed device like this are shown in FIG. 12. Each of the IP masks Mm5 to Mm9 shown in FIGS. 12A to 12E is a mask used in the transfer of circuit regions 10a to 10e of FIG. 11. These IP masks Mm5 to Mm9 are basically constituted of resist masks similarly to those described in the first embodiment. The specific structures of the IP masks Mm5 to Mm9 are the same as those described in the first embodiment with reference to FIGS. 2 to 5. Therefore, description thereof is omitted. Each of the IP masks Mm5 to Mm8 shown in FIGS. 12A to 12D is hatched in the same way as the circuit regions 10a to 10d so as to clarify that which patterns of the IP masks shown in FIG. 12 is transferred onto the circuit regions 10a to 10d on the chip 5c of FIG. 11. The IP mask Mm9 used in the transfer of the circuit region 10e for the user logic is not hatched similarly to the circuit region 10e shown in FIG. 11, which has the same meaning as above.

Next, a product mask manufactured by the use of the IP masks Mm5 to Mm9 described above is shown in FIG. 13. In the integrated circuit pattern region CA of this product mask Md4, a plurality of pattern transfer regions 12a to 12e are arranged. The pattern transfer region 12a has a pattern formed by the transfer using the IP mask Mm5 shown in FIG. 12A and also has a pattern to be transferred onto the circuit region 10a shown in FIG. 11. The pattern transfer region 12b has a pattern formed by the transfer using the IP mask Mm6 shown in FIG. 12B and also has a pattern to be transferred onto the circuit region 10b shown in FIG. 11. The pattern transfer region 12c has a pattern formed by the transfer using the IP mask Mm7 shown in FIG. 12C and also has a pattern to be transferred onto the circuit region 10c shown in FIG. 11. The pattern transfer region 12d has a pattern formed by the transfer using the IP mask Mm8 shown in FIG. 12D and also has a pattern to be transferred onto the circuit region 10D shown in FIG. 11. The pattern transfer region 12e has a pattern formed by the transfer using the IP mask Mm9 shown in FIG. 12E and also has a pattern to be transferred onto the circuit region 10e shown in FIG. 11. The pattern transferred onto the device surface of the wafer 5 using the product mask Md4 is schematically shown in FIG. 14.

Figure 13:
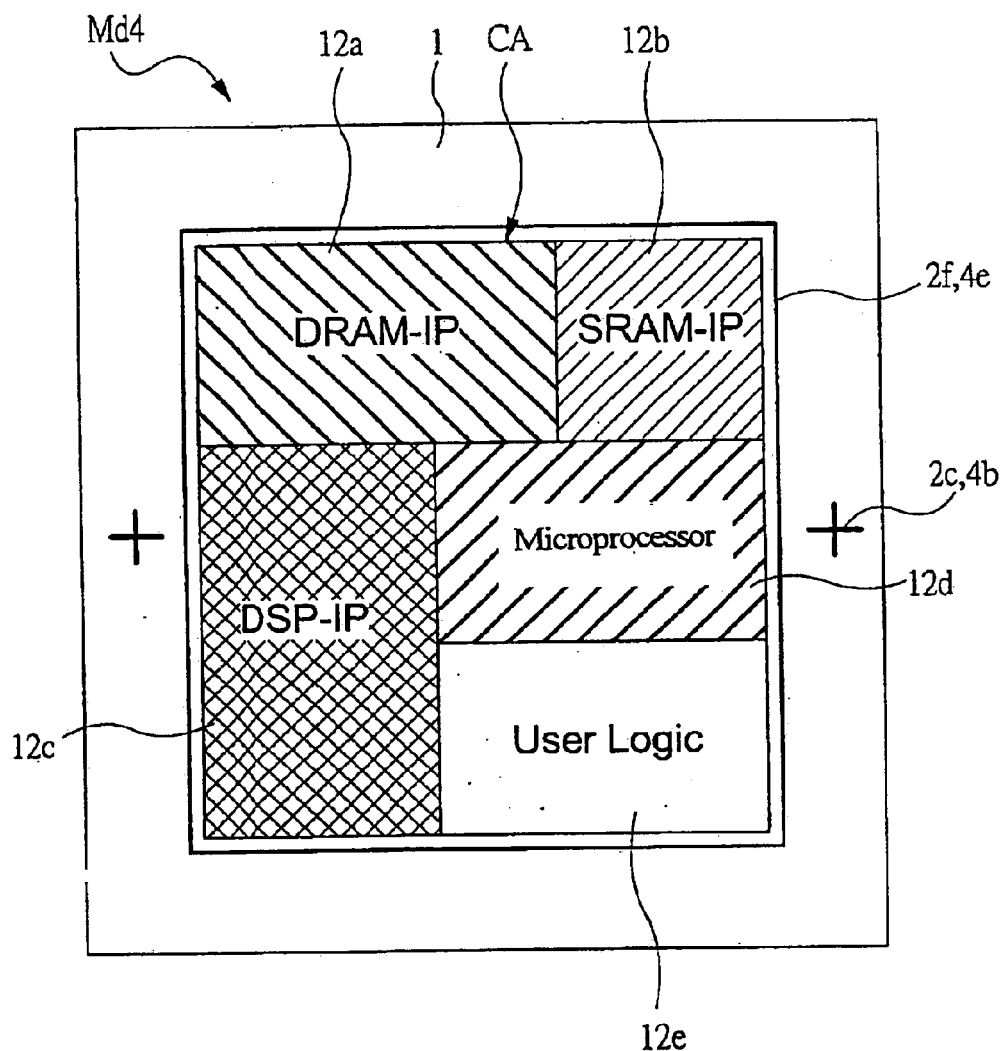
FIG. 13 is a general plan view showing an example of a photomask used to manufacture the semiconductor integrated circuit device of FIG. 11.
Figure 14:
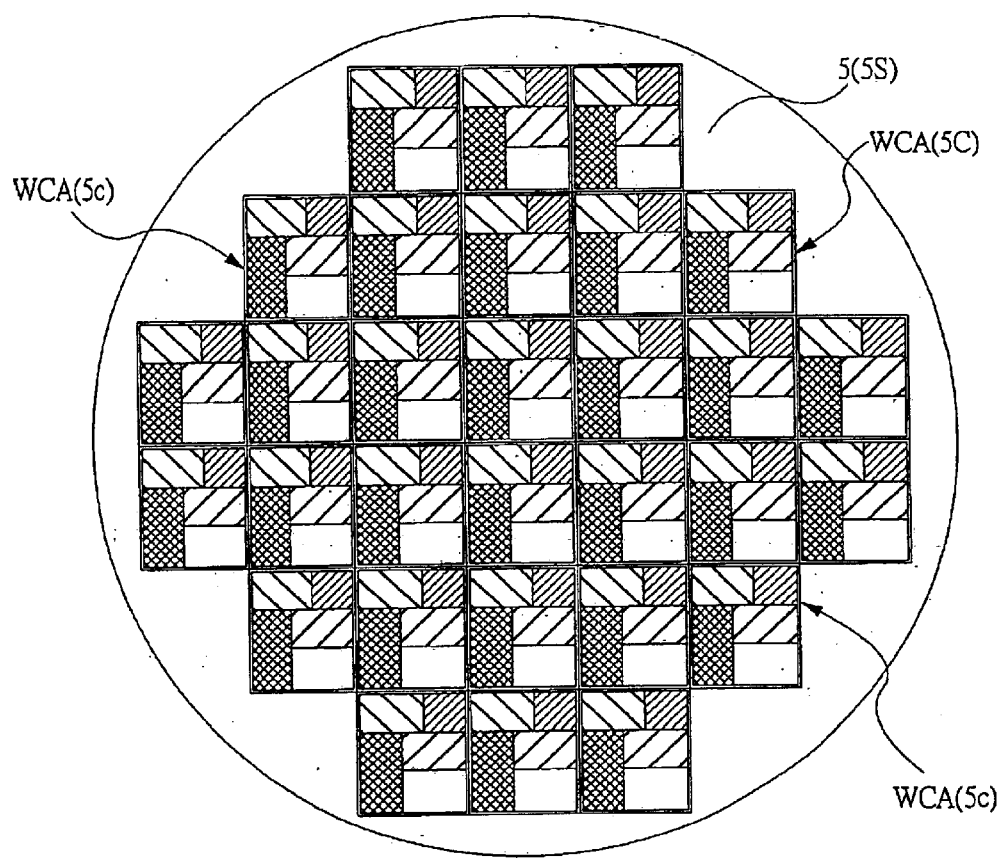
FIG. 14 is a general plan view of a semiconductor wafer in the manufacturing process of a semiconductor integrated circuit device according to another embodiment of the present invention.

Note that the pattern transfer regions 12a to 12e of the product mask Md4 in FIG. 13 and the chip forming region WCA in FIG. 14 are hatched in the same way as the circuit regions 10a to 10d so as to clarify that which patterns of the product mask Md4 shown in FIG. 13 is transferred onto the circuit regions 10a to 10d of the chip 5c of FIG. 11. The pattern transfer region 12e of the product mask Md4 used in the transfer of the circuit region 10e for the user logic and the logic circuit region 10e in the chip forming region WCA of the wafer 5 are not hatched similarly to the circuit region 10e shown in FIG. 11, which has the same meaning as above.

Next, a concrete example of manufacturing process of the mixed device like this will be described along the flow chart of FIG. 15 and by the use of FIGS. 16A to 16E and 17. Note that in FIGS. 16A to 16E and 17, the patterns of the circuit regions 10a to 10e in FIG. 11 are shown schematically as the alphabets D, S, DS, M, and U. Also, in FIGS. 16A to 16E and 17, the light-shielding patterns made of an organic film are hatched with thick lines and the light-shielding patterns made of metal are hatched with thin lines so as to make the drawings easy to see.

First, the electron beam resist film is coated on a first main surface of a mask substrate, and a pattern is written on the resist film by the electron beam writing performed thereto.

Subsequently, the development is performed thereto, thereby manufacturing an IP mask made of a resist mask having the light-shielding pattern constituted of an organic film such as a resist film (steps 100 and 101). An example of this IP mask is schematically shown in FIG. 16. IP masks Mm10 to Mm14 show a set of IP masks used to constitute the mixed device of FIG. 11. Each of the IP masks Mm10 to Mm14 is constituted of a resist mask. The IP masks Mm10 to Mm14 are masks used in the transfer of the circuit regions 10*a* to 10*e* of FIG. 11, respectively. The light-shielding pattern 2 made of the organic film is formed on each of the integrated circuit pattern regions of the IP masks Mm10 to Mm14. In the case where the normal mask is used as the IP mask, the etching step for the metal film is required after performing the electron beam writing. However, since the resist mask is used as the IP mask in this embodiment, such steps are unnecessary, and the IP mask is completed at the completion of the development. Here, a case where the light-shielding patterns 4 (4*b* and 4*c*) made of metal are arranged in the peripheral regions of the IP masks Mm10 to Mm14 is exemplified. However, the arrangement in the IP masks is not limited to these, and IP masks having a structure described in the first embodiment using FIGS. 2, 3, and 5 may be used.

Next, a product mask is manufactured using the set of the IP masks Mm10 to Mm14. Here, the normal mask is used as the product mask. First, a mask substrate for use in the product mask is prepared. A metal film made of, for example, chromium or chromium oxide is deposited on a first main surface of this mask substrate, and a resist film is coated thereon. Subsequently, after the mask substrate for use in the product mask is set on the sample stage E11 of the exposure apparatus EXP, the mask substrate is exposed while setting the IP masks Mm10 to Mm14 in turn on the mask stage E10 of the exposure apparatus EXP, and then development is performed thereto (step 102). Thereafter, the existence of the dislocation in the connection between the circuit regions (between the patterns of the pattern transfer regions) on the mask substrate 1 of the product mask is inspected (step 103). As a result of the inspection, if there is the dislocation in the connection therebetween, the resist pattern formed by the foregoing development is removed, and the product mask is formed again through the resist coating, the exposure, and the development as described above. As a result of the inspection, if there is no dislocation in the connection therebetween, the metal film exposed from an etching mask are etched to be removed while using the resist pattern as the etching mask, which is formed on the metal film on the mask substrate by the exposure using the IP masks Mm10 to Mm15, and thus the light-shielding pattern made of metal is manufactured (step 104). Consequently, the product mask is completed (step 105). An example of this product mask is schematically shown in FIG. 17. A product mask Md5 is constituted of the normal mask, and the light-shielding patterns 4 (4*b*, 4*d*, and 4*e*) made of a metal film are formed in each of the pattern transfer regions 12*a* to 12*e* in the integrated circuit pattern region CA and in the peripheral region.

Thereafter, the product mask is set on the exposure apparatus EXP, and then the resist film on the device surface of the wafer is developed. Thus, a plurality of chip forming regions are transferred onto the device surface of the wafer. Since the following manufacturing process is identical to that of a usual semiconductor integrated circuit device, description thereof is omitted.

(Third Embodiment)

In this third embodiment, a case where the product mask is constituted of the resist mask will be described. FIG. 18 shows an example of manufacturing process in the method of manufacturing the mixed device described in the second embodiment. Also, FIG. 19 shows an example of a product mask Md6. Note that the patterns of the circuit regions 10*a* to 10*e* of FIG. 11 are shown schematically as alphabets D, S, DS, M, and U, respectively. Also, in FIG. 19, the light-shielding patterns made of an organic film are hatched with thick lines so as to make the drawing easy to see.

In this embodiment, the steps 100 and 101 shown in FIG. 18 are performed similarly to the second embodiment, and the following process from the step 102*a* proceeds as follows.

First, a mask substrate for use in the product mask is prepared. A main surface of this mask substrate is not coated with a metal film, but coated with, for example, the electron beam resist film. Subsequently, after the mask substrate for use in the product mask is set on the sample stage E11 of the exposure apparatus EXP, the mask substrate is exposed while setting the IP masks Mm10 to Mm14 exemplified in FIG. 16 in turn on the mask stage E10 of the exposure apparatus EXP, and then the development is performed thereto (step 102*a*). In this step, the light-shielding pattern made of the resist pattern is formed on the mask substrate of the product mask. Thereafter, the existence of the dislocation in the connection between the circuit regions (between the patterns of the pattern transfer regions) on the mask substrate of the product mask is inspected (step 103*a*). As a result of the inspection, if there is the dislocation in the connection therebetween, the resist pattern formed by the development is removed, and the product mask is formed again through the resist coating, the exposure, and the development as described above. As a result of the inspection, if there is no dislocation in the connection therebetween, the product mask is completed (step 105*a*). After this step, inspection whether or not the defects exist in the patterns on the product mask may be performed. In such a case, the inspection of the patterns on the product mask may be performed in such a manner that the exposure is performed to a wafer using the product mask, and the resist pattern transferred onto the wafer is inspected. As a result of the inspection, if the pattern of the product mask is successful, the product mask is actually employed for the manufacturing of a semiconductor integrated circuit device, and if the pattern is unsuccessful, the light-shielding pattern made of an organic film is removed and the product mask is formed again. As described above, the pattern of the product mask is transferred onto the actual wafer to inspect the pattern of the product mask, whereby the inspection apparatus dedicated to the product mask becomes unnecessary. In addition, an apparatus for correcting the defects becomes unnecessary. Therefore, the mask cost can be reduced. Also, since the actually transferred pattern is inspected, the reliability of the inspection result is high. Accordingly, it is possible to provide a semiconductor integrated circuit device having high reliability. Also, owing to the high reliability of the inspection result, the occurrence of the case that the inspection must be performed again can be reduced. Thus, the reduction of the manufacturing time of the mask can be achieved. Note that such inspection techniques as described above are disclosed in Japanese Patent Application No. 2000-316965 (filed on Oct. 17, 2000) by the inventors of this application.

An example of this product mask is schematically shown in FIG. 19. A product mask Md6 is constituted of the resist mask, and the light-shielding patterns 2 (2*c*, 2*e*, and 2*f*) made of the organic film are formed in each of the pattern transfer regions 12*a* to 12*e* in the integrated circuit pattern region CA and in the peripheral region. In this case, since the step for etching the metal is completely unnecessary both in the manufacturing process of the IP mask and the manufacturing process of the product mask, a development period and a manufacturing time of the mixed device can be further reduced. Also, as described above, the dimensional precision of the pattern can be further improved. Furthermore, since mask cost can be reduced more than the case described in the first embodiment, the cost of the mixed device can be greatly reduced. The product mask is not limited to the example shown in FIG. 19, and for example, the product mask Md3 exemplified in FIG. 8 is also applicable.

(Fourth Embodiment)

In this embodiment, the case where only the predetermined IP masks among the set of the IP masks are the resist masks will be described. In this case, the IP masks to be used several times are metal masks, and the IP masks to be used only once or not more than a few times are resist masks, which are used for the transfer of, for example, a user logic section whose pattern are modified frequently. By doing so, the set of the IP masks can be manufactured efficiently. Therefore, the manufacturing time of the IP mask can be reduced, which makes it possible to deal with the prompt delivery of the semiconductor integrated circuit device. In addition, the cost of the set of the IP mask is reduced.

FIG. 20 shows an example of the manufacturing process of the mixed device of FIG. 11. FIGS. 21 to 23 show an example of a set of the IP masks Mm15 to Mm19. Note that in FIGS. 21 to 23, the patterns of the circuit regions 10a to 10e of FIG. 11 are shown schematically as the alphabets D, S, DS, M, and U, respectively. Also, in FIGS. 21 to 23, the light-shielding patterns made of an organic film are hatched with thick lines and the light-shielding patterns made of metal are hatched with thin lines so as to make the drawings easy to see.

First, the predetermined IP masks among the set of the IP masks are manufactured using the resist masks similarly to the second and third embodiments (steps 100a and 101a). On the other hand, the other predetermined IP masks among the set of the IP masks are manufactured using the normal masks. Here, the IP masks are manufactured according to the same manufacturing method as that of the normal masks. Specifically, after coating the electron beam resist film on a metal film of a mask substrate, a pattern is written thereon by the electron beam writing. Subsequently, the development is performed thereto to form the resist pattern. Thereafter, the lower metal film is patterned using the resist pattern as an etching mask. As described above, the IP mask constituted of the normal mask is manufactured (steps 100b, 101b, and 101c).

An example of the set of the IP masks manufactured as described above is shown in FIG. 21. The IP masks Mm15 to Mm18 are normal masks. The IP masks Mm 15 to Mm18 are used to transfer the pattern of the circuit regions 10a to 10d of FIG. 11 onto the product mask, respectively. The light-shielding patterns 4 (4f) made of, for example, a metal film such as chromium and chromium oxide are formed on each of the IP masks Mm15 to Mm18.

On the other hand, the IP mask Mm19 is the resist mask. This IP mask Mm19 is used to transfer the pattern of the circuit region 10e of FIG. 11 onto the product mask. Specifically, the IP mask Mm19 is used in the transfer of the pattern of the user logic circuit section. In this embodiment, a type of the resist mask structure described in FIG. 4 of the first embodiment has been exemplified. However, it is not limited to this, and the type of the resist mask structures described in FIGS. 2, 3, and 5 may also be employed.

A state where the light-shielding pattern 2 (2a) of the IP mask Mm19 is removed is shown in FIG. 22. In the case of modifying the pattern of the IP mask Mm19, the electron beam resist film is coated on the first main surface of the mask substrate 1 of FIG. 22E, and the electron beam writing is performed thereto to write a pattern, thereby a new light-shielding pattern 2 (2a) made of the organic film is formed as shown in FIG. 23, thus manufacturing an IP mask Mm20. Consequently, it becomes possible to deal with the pattern modification of the user flexibly and in a short time, and also the prompt delivery of products is achieved. Specifically, it becomes possible to provide various kinds of different products in a short time. Since it is also possible to deal with the pattern modifications for the experiment of electric properties flexibly and in a short time, a development period of the product can be reduced.

After preparing the set of the IP masks Mm15 to Mm19 as described above, the product mask is manufactured using them. Since the manufacturing process of this product mask is the same as that described in the third embodiment, the description thereof is omitted.

(Fifth Embodiment)

In this fifth embodiment, the case where a part of the product mask is modified will be described. FIG. 24 shows a concrete example of the manufacturing process according to the method of manufacturing the mixed device of FIG. 11.

First, as shown in FIG. 24, a set of IP masks are manufactured similarly to the second to fourth embodiments. The IP masks in this embodiment may be normal masks, resist masks, or the combination of the normal mask and the resist mask (step 200). Subsequently, the mask substrate for use in the product mask is set on the sample stage E11 of the exposure apparatus EXP. On this mask substrate, for example, the metal film similar to that described in FIG. 4 is deposited, and the resist film is coated thereon. Then, the mask substrate is exposed while setting the IP masks in turn on the mask stage E10 of the exposure apparatus EXP, thereby transferring the patterns of the IP masks onto the resist film of the mask substrate of the product mask. Then, the development is performed (step 201). Thereafter, the resist pattern formed on the mask substrate for use in the product mask is inspected. At this time, the existence of the dislocation in connection between the pattern transfer regions of the product mask is inspected (step 202). As a result of the inspection, if there is the dislocation in the connection therebetween, the product mask is manufactured again. On the other hand, if there is no dislocation inspected, the lower metal film is patterned by the etching method using the resist pattern as an etching mask, thus manufacturing an intermediate master mask (steps 203 and 204).

An example of this intermediate master mask is shown in FIG. 25. This intermediate master mask Mda is not completed as the product mask, that is, an incomplete mask. In the pattern transfer regions 12a to 12d of the intermediate master mask Mda, the light-shielding pattern 4 (4d) made of, for example, a metal film is formed. However, in the pattern transfer region 12e used in the transfer of the pattern in the circuit region of the user logic circuit section, no light-shielding pattern is formed. Note that the patterns of the circuit regions 10a to 10d of FIG. 11 are schematically shown as the alphabets D, S, DS, and M in FIG. 25. In addition, the light-shielding patterns made of a metal film are hatched with the thin lines so as to make the drawing easy to see.

Subsequently, after coating the electron beam resist film on a first main surface of a mask substrate 1 of the intermediate master mask Mda, this mask substrate 1 is set on the sample stage E11 of the exposure apparatus EXP, and the IP mask used in the transfer of the pattern onto the circuit region 10e shown in FIG. 11 is set on the mask stage E10. In this state, exposure and development are successively performed thereto (step 205). As described above, with respect to the resist pattern formed on the mask substrate 1 of the intermediate master mask Mda, the existence of the dislocation in connection between the pattern transfer regions is inspected (step 206). As a result of the inspection, if there is the dislocation in the connection therebetween, the product mask is formed again. On the other hand, if there is no dislocation in the connection therebetween, a product mask having the resist pattern as the light-shielding pattern is manufactured (step 207).

An example of the product mask is shown in FIG. 26. For example, the light-shielding pattern 2 (2e) made of the organic film is formed in the pattern transfer region 12e of this product mask Md7. Specifically, in the product mask Md7 of this embodiment, both of the light-shielding pattern 4 (4d) made of metal and the light-shielding pattern 2 (2e) made of an organic film are arranged in the integrated circuit pattern region CA of the first main surface of the same mask substrate 1. In FIG. 26, the patterns of the circuit regions 10a to 10e of FIG. 11 are shown schematically as alphabets D, S, DS, M, and U, respectively. Also, in FIG. 26, the light-shielding patterns made of a metal film are hatched with thin lines and the light-shielding patterns made of an organic film are hatched with thick lines so as to make the drawings easy to see. Also, the technique of the partial resist mask is disclosed in the Japanese Patent Applications No. 2000-206728 and No. 2000-206729 (both filed on Jul. 7, 2000) by the inventors of this application.

Next, a method of modifying the patterns of the product mask as described above will be described. FIG. 27 shows an example of the process of the modification method. In case of modifying the patterns of, for example, the user logic circuit section, firstly, the light-shielding pattern 2 (2e) made of an organic film in the pattern transfer region 12e of the product mask Md7 is removed to wash the product mask Md7 (step 300). Thus, the product mask Md7 returns to the intermediate master mask Mda shown in FIG. 25 (step 301). Thereafter, as shown in FIG. 28, through the steps identical to those described in FIG. 24, a new light-shielding pattern 2 (2e) made of an organic film having a circuit structure, which is different from that of the light-shielding pattern 2 (2e) formed in the pattern transfer region 12e of the old product mask Md7 shown in FIG. 26, is formed in the pattern transfer region 12e of the product mask Md8 used in the transfer of the user logic circuit section. As described above, it becomes possible to manufacture the mixed devices having different circuit structures in a short time. The above-described method of manufacturing the product mask is also suitable to the case of providing the mixed devices of the same type but having a little different electrical properties in series. The method of manufacturing the product mask like this is also suitable to the case where mixed devices having various electrical properties for use in experiments are manufactured so as to select the optimum one among such electrical properties during the development of such devices. This is because the large amount of data can be obtained in a short time.

(Sixth Embodiment)

In this embodiment, the case where the present invention is applied to, for example, DRAM will be exemplified. An example of the DRAM is shown in FIG. 29.

A plurality of memory mats 15 are regularly arranged in an inner circuit region IA positioned at the center of the chip 5C. A plurality of memory cells each having, for example, one MISFET (Metal Insulator Semiconductor Field Effect Transistor) and one capacitor are regularly arranged in each of the memory mats 15. Each of the memory cells is arranged in the vicinity of the intersection point between a word line and a data line laid so as to cross the word line. In addition, peripheral circuit regions 16a and 16b are arranged in the vicinity of each of the memory mats 15. Various peripheral circuits such as a decoder circuit, a sense amplifier circuit, and a driver circuit are arranged in the peripheral circuit regions 16a and 16b. Moreover, a plurality of outer terminals 11 are arranged in an outer peripheral areas near the shorter sides of the inner circuit region IA.

Next, an example of the IP mask in this embodiment will be described. In this embodiment, an IP mask (first IP mask) used in the transfer of the pattern of the memory mat 15 and an IP mask (second IP mask) used in the transfer of the pattern of the peripheral circuit region are prepared. FIG. 30 shows an example thereof. FIGS. 30A to 30C show an IP mask Mm20 used in the transfer of the pattern of the memory mat 15, an IP mask Mm21 used in the transfer of the pattern of the peripheral circuit region 16a, and an IP mask Mm22 used in the transfer of the pattern of the peripheral circuit region 16b, respectively.

The IP masks Mm20 to Mm22 are constituted of the resist masks. Here, though the resist mask structure shown in FIG. 4 is described, the structure is not limited to this and various modifications and alterations can be made thereto. The resist mask structure exemplified in FIGS. 2, 3, and 5 can be applied. In addition, one or two of the IP masks Mm20 to Mm22 may be the resist mask, and other IP masks may be the normal masks.

In this example, one IP mask Mm20 is provided with one region for the transfer of the memory mat. However, the IP mask is not limited to this, and a plurality of regions (block unit or chip unit) for the transfer of the patterns onto the memory mats may be provided on one IP mask Mm20.

A product mask is manufactured using the IP masks Mm20 to Mm22 as described above. The manufacturing method thereof is identical to that of the first to fifth embodiments. Therefore, description thereof is omitted. A state of the product mask in which patterns thereof are formed by the transfer using the IP mask Mm20 only is shown in FIG. 31. Pattern transfer regions 12m are the regions used in the transfer of the pattern of the memory mat 15 shown in FIG. 29. Also, an example of the product mask manufactured using the IP masks Mm20 to Mm22 is shown in FIG. 32. Pattern transfer regions 12p1 and 12p2 of the product mask Md9 are the regions used in the transfer of the patterns of the peripheral circuit regions 16a and 16b shown in FIG. 29. The product mask Md9 may have a resist mask structure and a normal mask structure. In the case of the resist mask structure, the advantages the same as those of the first to fifth embodiments can be obtained. Especially, the manufacturing time of the mask can be reduced. Also, the mask cost can be reduced. On the other hand, with respect to the memory products such as DRAM, since mass production can be expected and the product mask Md9 is used several times, the increase of the mask cost can be canceled out. Therefore, the increase of the mask cost can be avoided even if the product mask Md9 is the normal mask. Also, in the case where the product mask Md9 is used several times, it is preferable that the product mask Md9 is the normal mask because a certain amount of durability (light resistance and mechanical resistance) is required.

In the foregoing, the invention made by the inventors of the present invention has been concretely described based on the embodiments. However, it is needless to say that the present invention is not limited to the foregoing embodiments and various modifications and alterations can be made without departing from the scope of the present invention.

For example, after forming the light-shielding pattern made of an organic film by the development, a so-called hardening treatment such as heat treatment and irradiation of the intense ultraviolet rays in advance may be performed to the resist film with the aim to improve the resistance to the exposure light irradiation.

Also, in the foregoing first to sixth embodiments, the case where the pattern made of an organic film on the mask substrate is used as the light-shielding pattern has been described. However, the present invention is not limited to this. Specifically, the pattern made of an organic film can be used as a light-reducing pattern or a halftone pattern.

Also, in the sixth embodiment, the case where the present invention is applied to the method of manufacturing DRAM has been described. However, the present invention is not limited to this. For example, the present invention can be applied to the methods of manufacturing other memories such as SRAM, mask ROM, and flash memory (EEPROM). Also in these cases, the memory mat and the peripheral circuit region are exposed using different IP masks as described in the sixth embodiment.

In the foregoing description, description has been made mainly to the case where the present invention made by the inventors thereof is applied to the method of manufacturing a semiconductor integrated circuit device, which is an application field of the present invention and is a background of the same. However, the present invention is not limited to this and the present invention can be applied to, for example, the methods of manufacturing a liquid crystal panel, a disk array, or a micro machine.

The advantages achieved by the typical ones of the inventions disclosed in this application will be briefly described as follows.

(1) According to the present invention, since a resist mask is used as a first mask, etching process in the patterning step of the mask pattern of the first mask becomes unnecessary. Therefore, it is possible to reduce the manufacturing time of a mask.

(2) According to the present invention, since a resist mask is used as a first mask, etching process in the patterning step of the mask pattern becomes unnecessary. Therefore, it is possible to reduce the manufacturing time of a mask. Thus, the manufacturing time of a semiconductor integrated circuit device can be reduced.

(3) According to the present invention, since a resist mask is used as a first mask, etching process in the patterning step of the mask pattern becomes unnecessary. Therefore, the cost of the mask can be reduced.

(4) According to the present invention, since a resist mask is used as a first mask, it becomes possible to reduce the cost of the mask. Therefore, the cost of the semiconductor integrated circuit device can be reduced.

What is claimed is:

1. A method of manufacturing a semiconductor integrated circuit device, comprising the steps of:
   (a) preparing a set of first photomasks including one or more resist masks;
   (b) transferring each pattern of a plurality of first photomasks onto a second photomask by reduced projection exposure; and
   (c) transferring the pattern on said second photomask onto a semiconductor wafer by reduced projection exposure, wherein said set of first photomasks include at least one photomask having an alignment mark made of organic film having a light-shielding property or a light-reducing property to exposure light.

2. The method of manufacturing a semiconductor integrated circuit device according to claim 1, wherein a metal pattern having a light-shielding property to exposure light is arranged in an integrated circuit pattern region of said second photomask.

3. The method of manufacturing a semiconductor integrated circuit device according to claim 1, wherein an organic film pattern having a light-shielding property or a light-reducing property to exposure light is arranged in an integrated circuit pattern region of said second photomask.

4. The method of manufacturing a semiconductor integrated circuit device according to claim 1, wherein both of a metal pattern having a light-shielding property to exposure light and an organic film pattern having a light-shielding property or a light-reducing property to exposure light are arranged in an integrated circuit pattern region of said second photomask.

5. The method of manufacturing a semiconductor integrated circuit device according to claim 4, further comprising the step of removing said organic film pattern of said second photomask.

6. A method of manufacturing a semiconductor integrated circuit device, comprising the steps of:
   (a) preparing a plurality of IP masks, at least one of which is made of a resist mask,
   (b) transferring each pattern of said plurality of IP masks onto a product mask by reduced projection exposure;
   (c) transferring a pattern of said product mask onto a semiconductor wafer by reduced projection exposure, wherein said plurality of IP masks include at least one IP mask having an alignment mark made of organic film having a light-shielding property or a light-reducing property to exposure light.

7. The method of manufacturing a semiconductor integrated circuit device according to claim 6, wherein a metal pattern having a light-shielding property to exposure light is arranged in an integrated circuit pattern region of said product mask.

8. The method of manufacturing a semiconductor integrated circuit device according to claim 6, wherein an organic film pattern having a light-shielding property or a light-reducing property to exposure light is arranged in a light-shielding pattern of an integrated circuit pattern region of said product mask.

9. The method of manufacturing a semiconductor integrated circuit device according to claim 6, wherein both of a metal pattern having a light-shielding property to exposure light and an organic film pattern having a light-shielding property or a light-reducing property to exposure light are arranged in an integrated circuit pattern region of said product mask.

10. The method of manufacturing a semiconductor integrated circuit device according to claim 9, further comprising the step of removing said organic film pattern of said product mask.

11. A method of manufacturing a semiconductor integrated circuit device, comprising the steps of:
   (a) preparing at least one IP mask made of a resist mask, which is a photomask used in transfer of a memory mat or an aggregate of the memory mats;
   (b) transferring the pattern of said IP mask onto a product mask by reduced projection exposure; and
   (c) transferring the pattern of said product mask onto a semiconductor wafer by the reduced projection exposure, wherein said at least one IP mask has an alignment mark made of organic film having a light-shielding property or a light-reducing property to exposure light.

12. The method of manufacturing a semiconductor integrated circuit device according to claim 11, wherein a metal pattern having a tight-shielding property to exposure light is arranged in an integrated circuit pattern region of said product mask.

13. The method of manufacturing a semiconductor integrated circuit device according to claim 11, wherein an organic film pattern having a light-shielding property or a light-reducing property to exposure light is arranged in an integrated circuit pattern region of said product mask.

14. A method of manufacturing a semiconductor integrated circuit device, comprising the steps of:
  (a) preparing a first IP mask made of a resist mask, which is a photomask used in a transfer of a memory mat or an aggregate of the memory mats;
  (b) preparing a second IP mask made of a resist mask, which is a photomask used in a transfer of a peripheral circuit region of said memory mat;
  (c) transferring the patterns of said first and second IP masks onto a product mask by reduced projection exposure; and
  (d) transferring the pattern of said product mask onto a semiconductor wafer by reduced projection exposure,
  wherein said first IP mask and said second IP mask have an alignment mask made of organic film having a light-shielding property or a light-reducing property to exposure light.

15. The method of manufacturing a semiconductor integrated circuit device according to claim 14, wherein a metal pattern having a light-shielding property to exposure light is arranged in an integrated circuit pattern region of said product mask.

16. The method of manufacturing a semiconductor integrated circuit device according to claim 14, wherein an organic film pattern having a light-shielding property or a light-reducing property to exposure light is arranged in an integrated circuit pattern region of said product mask.

17. The method of manufacturing a semiconductor integrated circuit device according to claim 1, wherein all of the set of first photomasks have an alignment mark made of organic film having a light-shielding property or a light-reducing property to exposure light.

18. The method of manufacturing a semiconductor integrated circuit device according to claim 6, wherein all of a set of IP masks have an alignment mark made of organic film having a light-shielding property or a light-reducing property to exposure light.

19. The method of manufacturing a semiconductor integrated circuit device according to claim 12, wherein there are a plurality of said IP masks, and all of said plurality of IP masks have an alignment mark made of organic film having a light-shielding property or a light-reducing property to exposure light.

* * * * *